(12) United States Patent
Cheng

(10) Patent No.: US 10,680,107 B2
(45) Date of Patent: Jun. 9, 2020

(54) NANOSHEET TRANSISTOR WITH STABLE STRUCTURE

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/139,840

(22) Filed: Sep. 24, 2018

(65) Prior Publication Data

US 2020/0098915 A1 Mar. 26, 2020

(51) Int. Cl.
| | |
|---|---|
| *H01L 29/49* | (2006.01) |
| *H01L 29/78* | (2006.01) |
| *H01L 29/06* | (2006.01) |
| *H01L 29/08* | (2006.01) |
| *H01L 29/66* | (2006.01) |
| *H01L 21/308* | (2006.01) |
| *H01L 21/8238* | (2006.01) |
| *H01L 21/8234* | (2006.01) |

(52) U.S. Cl.
CPC ...... *H01L 29/7848* (2013.01); *H01L 21/3085* (2013.01); *H01L 21/823431* (2013.01); *H01L 21/823807* (2013.01); *H01L 21/823814* (2013.01); *H01L 21/823821* (2013.01); *H01L 21/823878* (2013.01); *H01L 29/0653* (2013.01); *H01L 29/0847* (2013.01); *H01L 29/66545* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| | | |
|---|---|---|
| 9,209,177 B2 | 12/2015 | Kim et al. |
| 9,324,866 B2 | 4/2016 | Yu et al. |
| 9,449,835 B2 | 9/2016 | Jang et al. |
| 9,660,028 B1 * | 5/2017 | Cheng ................. H01L 29/0673 |
| 9,704,994 B1 | 7/2017 | Cheng et al. |
| 9,870,948 B2 | 1/2018 | Cheng et al. |
| 9,899,265 B2 | 2/2018 | Ho et al. |
| 9,923,080 B1 | 3/2018 | Greene et al. |

(Continued)

*Primary Examiner* — Ali Naraghi
(74) *Attorney, Agent, or Firm* — Scully, Scott, Murphy & Presser, P.C; L. Jeffrey Kelly, Esq.

(57) ABSTRACT

Sacrificial gate structures are simultaneously formed in isolation regions that are wider than the sacrificial gate structures formed in the active region. The wider sacrificial gate structures are formed by taking advantage of a smaller lateral etch of p-type silicon than undoped or n-type doped silicon during reactive ion etching. Amorphous or polycrystalline silicon is used as a sacrificial pattern transfer patterning layer in the gate patterning process. The p-type amorphous or polycrystalline silicon increases the sacrificial gate structure length in the isolation region and thus reduces spacing between the sacrificial gate structures in the isolation region. During inner spacer formation, the inner spacers pinch-off all sacrificial gate structures in the isolation region preventing the shallow trench isolation structure to be undercut and thus preventing the collapsing of the sacrificial gate structures in the isolation region.

10 Claims, 16 Drawing Sheets

(56) References Cited

U.S. PATENT DOCUMENTS

| | | | |
|---|---|---|---|
| 9,984,936 B1* | 5/2018 | Xie | H01L 29/775 |
| 10,050,107 B1* | 8/2018 | Cheng | H01L 21/30604 |
| 10,229,971 B1* | 3/2019 | Cheng | H01L 29/511 |
| 2016/0099243 A1* | 4/2016 | Azmat | H01L 27/088 |
| | | | 257/368 |
| 2017/0213739 A1* | 7/2017 | Gluschenkov | H01L 21/28518 |
| 2017/0294354 A1 | 10/2017 | Peddeti | |
| 2018/0005834 A1 | 1/2018 | Cheng et al. | |
| 2018/0076094 A1 | 3/2018 | Basker et al. | |
| 2019/0081151 A1* | 3/2019 | Lee | H01L 29/4908 |

* cited by examiner

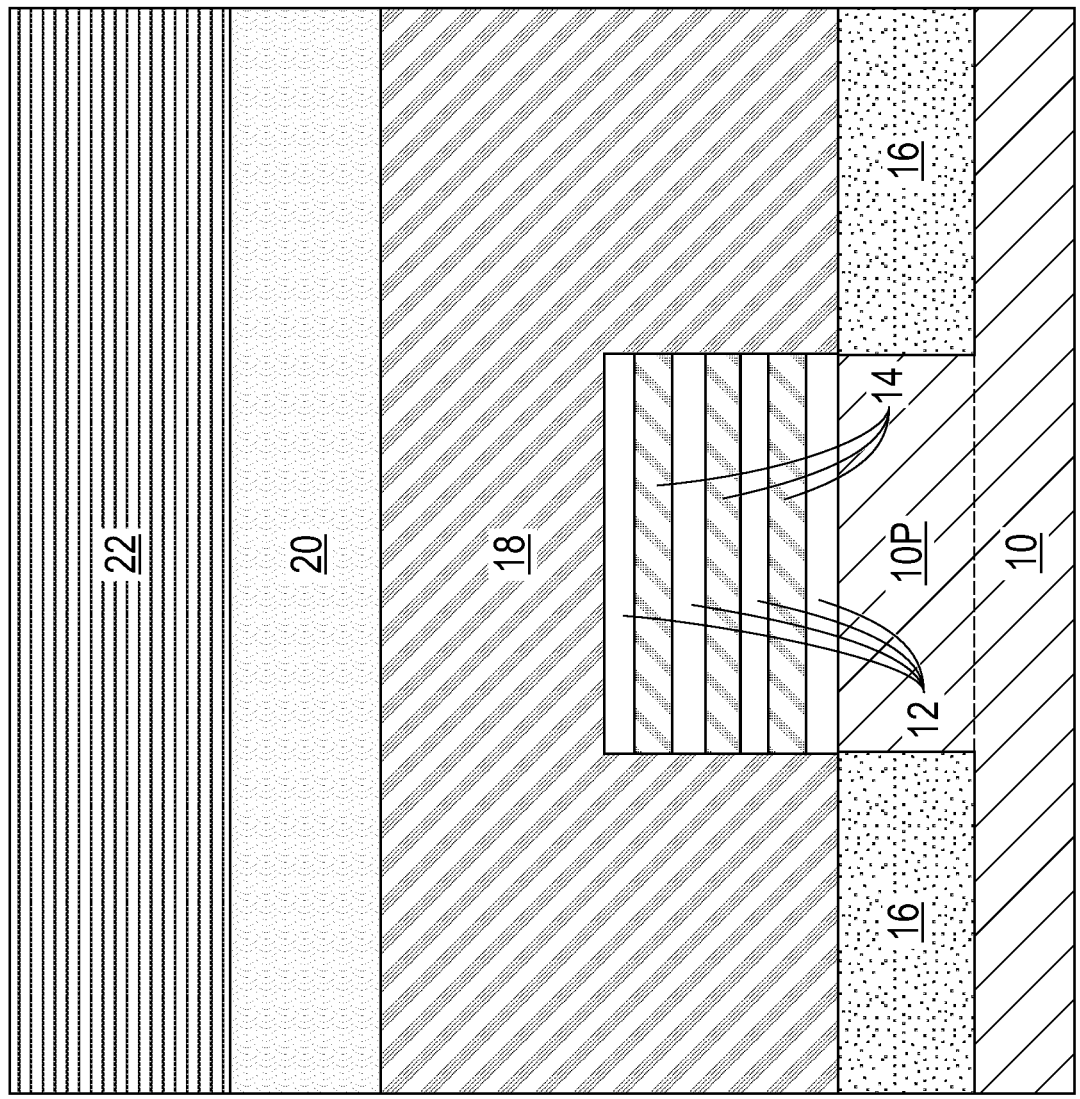

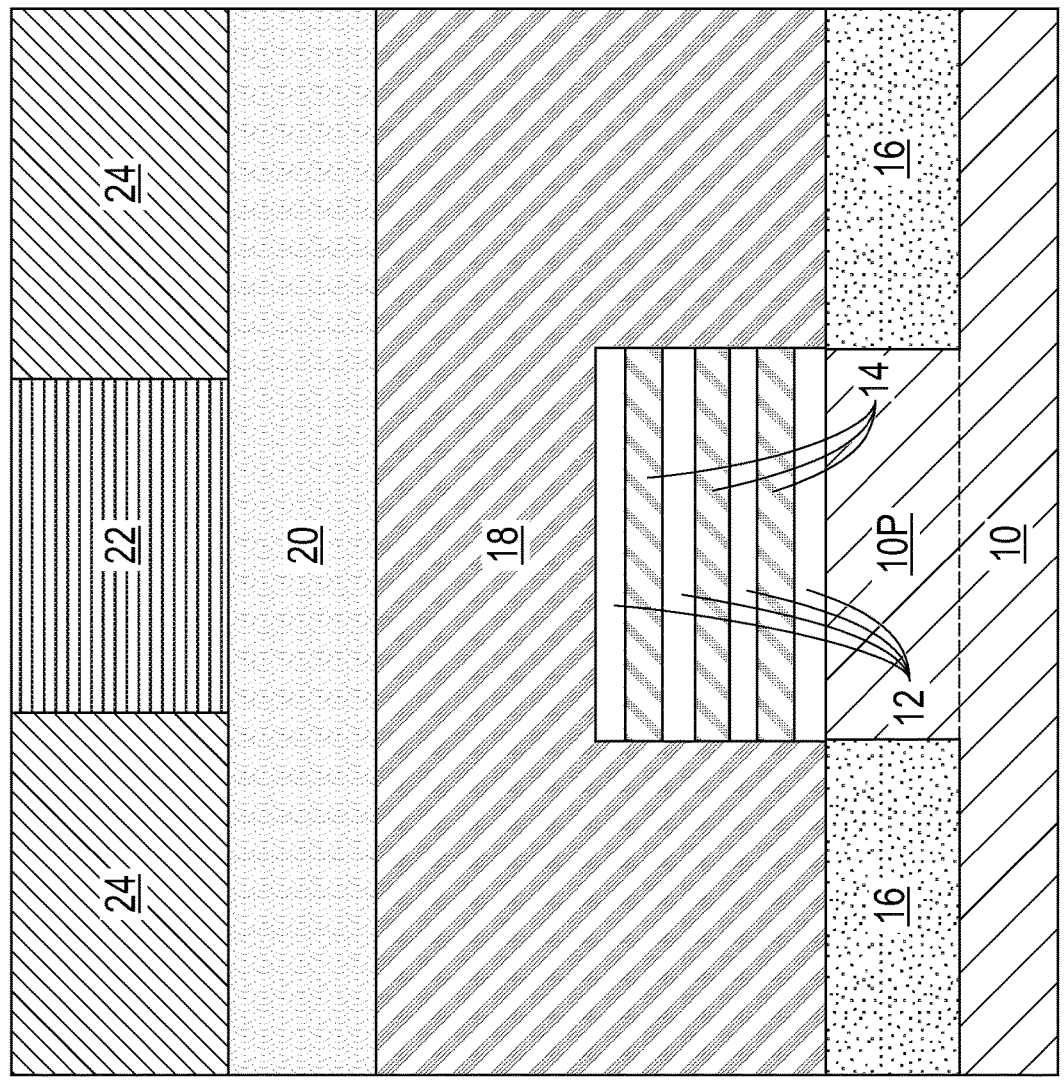

US 10,680,107 B2

1

NANOSHEET TRANSISTOR WITH STABLE STRUCTURE

BACKGROUND

The present application relates to a semiconductor structure and a method of forming the same. More particularly, the present application relates to a nanosheet containing device (i.e., transistor) having a short gate length without exhibiting any sacrificial gate structure collapsing issues.

The use of non-planar semiconductor devices such as, for example, a nano sheet containing device is the next step in the evolution of complementary metal oxide semiconductor (CMOS) devices. By "nanosheet containing device" it is meant that the device contains one or more layers of semiconductor channel material portions (i.e., nanosheets) having a vertical thickness that is substantially less than its width. Nanosheet containing device formation relies on the selective removal of one semiconductor material (e.g., a silicon germanium alloy) to another semiconductor material (e.g., silicon) to form suspended nanosheets for gate-all-around devices.

CMOS scaling of such nanosheet containing devices requires a reduction in gate length to accommodate a reduction of contract gate pitch. For example, for 5 nm node, the gate length target is about 15 nm for a contact gate pitch of about 44 nm.

Moreover, and during a source/drain epitaxy preclean step, an oxide etch is typically performed to clean the nanosheet region to ensure high quality epitaxy. In the active nanosheet regions, the sacrificial gate structures wrap around the nanosheets so that the sacrificial gate structures are mechanically stable. In other words, the nanosheets serve as an anchor to hold the sacrificial gate structures stable in the active region. In the isolation region, the sacrificial gate structures sit on a shallow trench isolation (STI) structure. It has been determined that the epitaxy preclean step undercuts the STI structure underneath the sacrificial gate structures causing the sacrificial gate structures to collapse in the isolation region. Sacrificial gate structure collapse causes defect and yield issues. There is thus a need for providing nanosheet transistors having a short gate length in which sacrificial gate structure collapsing issues have been mitigated.

SUMMARY

Sacrificial gate structures are simultaneously formed in an isolation region that are wider than the sacrificial gate structures formed in the active region. The wider sacrificial gate structures are formed by taking advantage of a smaller lateral etch of p-type silicon than undoped or n-type doped silicon during reactive ion etching. Amorphous or polycrystalline silicon is used as a sacrificial pattern transfer patterning layer in the gate patterning process. The p-type amorphous or polycrystalline silicon increases the sacrificial gate structure length in the isolation region and thus reduces spacing between the sacrificial gate structures in the isolation region. During inner spacer formation, the inner spacers pinch-off all sacrificial gate structures in the isolation region preventing the shallow trench isolation structure to be undercut and thus preventing the collapsing of the sacrificial gate structures in the isolation region.

In one aspect of the present application, a semiconductor structure is provided. In one embodiment, the semiconductor structure includes a shallow trench isolation structure laterally surrounding a semiconductor material pedestal region. A non-active gate structure is located on the shallow trench isolation structure, and an active gate structure having a length that is less than a length of the non-active gate structure is located on the semiconductor material pedestal region. The active gate structure wraps around a portion of each semiconductor channel material nanosheet of a plurality of suspended semiconductor channel material nano sheets.

In some embodiments, a transition gate structure having a length that is less than the length of the non-active gate structure, but greater than the length of the active gate structure is located between the non-active gate structure and the active gate structure and present partially on the shallow trench isolation structure and partially on the semiconductor material pedestal region.

In another aspect of the present application, a method of forming a semiconductor structure is provided. In one embodiment, the method includes forming a structure comprising at least one semiconductor material stack structure of alternating layers of a sacrificial semiconductor material and a semiconductor channel material on a surface of a semiconductor material pedestal region, wherein a shallow trench isolation structure laterally surrounds the semiconductor material pedestal region. Next, a sacrificial gate structure is formed on the shallow trench isolation structure, and another sacrificial gate structure is simultaneously formed on the semiconductor material pedestal region, wherein the sacrificial gate structure that is located on the shallow trench isolation structure has a length that is greater than a length of the another sacrificial gate structure that is located on the semiconductor material pedestal region. The physically exposed portions of the at least one semiconductor material stack structure are then removed to provide at least one nanosheet material stack of alternating nanosheets of sacrificial semiconductor material and semiconductor channel material located beneath the another sacrificial gate structure located on the semiconductor material pedestal region. An anchoring dielectric spacer is formed laterally adjacent to the sacrificial gate structure located on the shallow trench isolation structure. Next, the sacrificial gate structure and the another sacrificial gate structure are removed to provide gate cavities, and thereafter each semiconductor channel material nanosheet is suspended. A gate structure is then formed in each gate cavity, wherein the gate structure located over the shallow trench isolation structure has a length that is greater than a length of the gate structure located over the semiconductor material pedestal region.

BRIEF DESCRIPTION OF THE DRAWINGS

FIG. 2 is a cross sectional view of the exemplary semiconductor structure of FIGS. 1A, 1B and 1C after forming a sacrificial gate material layer, a sacrificial gate hardmask layer, and a non-doped sacrificial pattern transfer patterning layer.

FIG. 3 is a cross sectional view of the exemplary semiconductor structure of FIG. 2 after introducing a p-type dopant into the non-doped sacrificial pattern transfer patterning layer that is located over the shallow trench isolation structure to provide a p-doped sacrificial pattern transfer patterning layer, while maintaining the non-doped sacrificial pattern transfer patterning layer over the semiconductor material pedestal region.

DETAILED DESCRIPTION

Figure 1A:
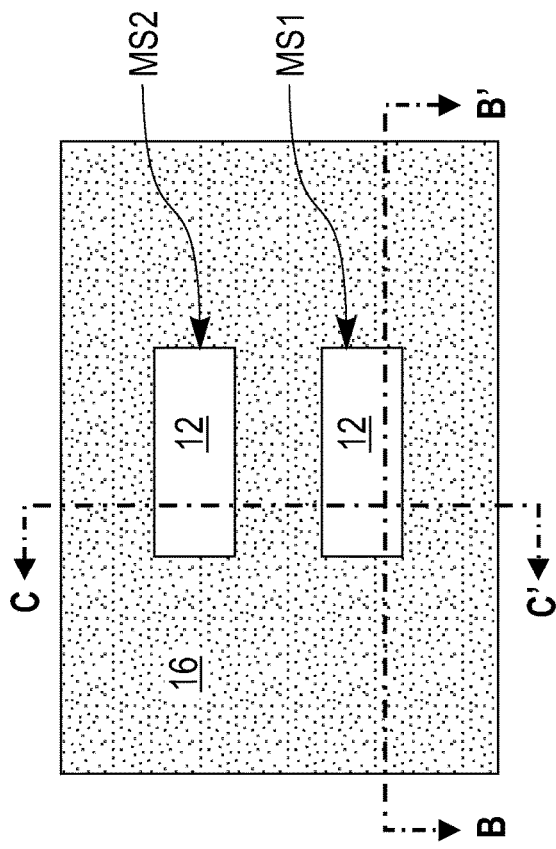
FIG. 1A is a top down view of an exemplary semiconductor structure that can be employed in the present application which includes at least one semiconductor material stack structure including alternating layers of a sacrificial semiconductor material and a semiconductor channel material and located on a semiconductor material pedestal region, wherein a shallow trench isolation structure laterally surrounds the semiconductor material pedestal region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1C:
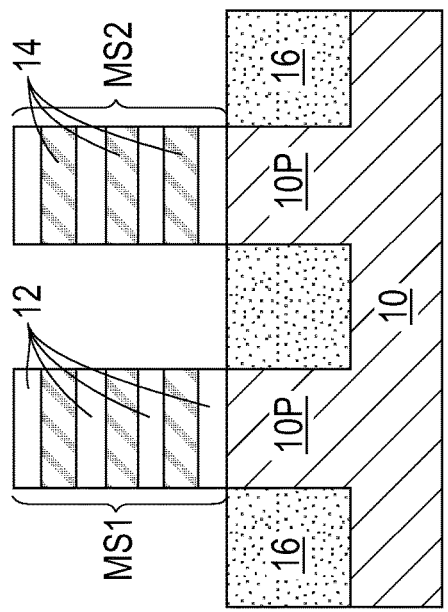
FIG. 1C is a cross sectional view through line C-C' which lines perpendicular to the at least one semiconductor material stack structure.
Figure 1B:
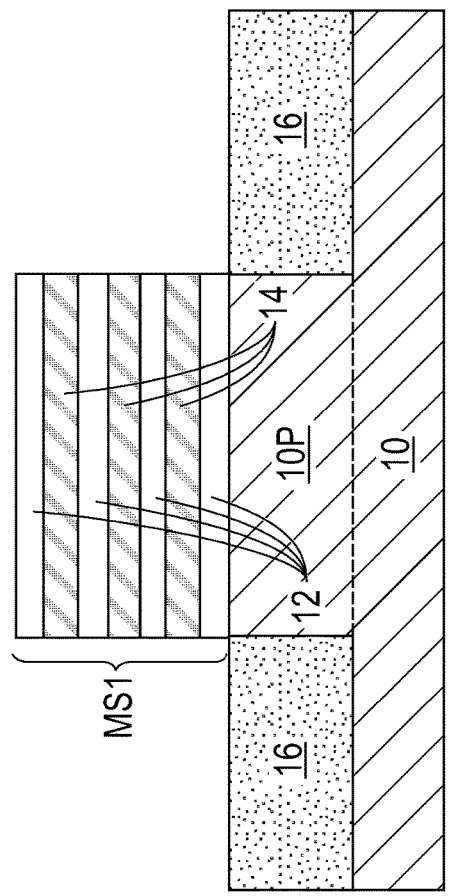
FIG. 1B is a cross sectional view through line B-B' which lines parallel to the at least one semiconductor material stack structure.

Referring first to FIGS. 1A, 1B and 1C, there are shown various views of an exemplary semiconductor structure that can be employed in the present application which includes at least one least one semiconductor material stack structure (MS1 and MS2) including alternating layers of a sacrificial semiconductor material 12 and a semiconductor channel material 14 and located on a semiconductor material pedestal region 10P, wherein a shallow trench isolation structure 16 laterally surrounds the semiconductor material pedestal region 10P. In the present application, the shallow trench isolation structure 16 defines an isolation region of the structure, while the semiconductor material pedestal region 10P defines an active region of the structure. As is shown, the semiconductor material pedestal region 10P and the shallow trench isolation structure 16 are located on a base semiconductor material layer 10.

In the illustrated embodiment, a first semiconductor material stack structure MS1, and a second semiconductor material stack structure MS2 are shown. Although the present application describes and illustrates the presence of two semiconductor material stack structures (MS1 and MS2), the present application is not limited to the presence of two semiconductor material stack structures. Instead, the present application contemplates embodiments in which only one semiconductor material stack structure is present, or more than two semiconductor material stack structures are present. When multiple semiconductor material stack structures are employed, each is formed on a semiconductor material pedestal region 10P and the semiconductor material stack structures are oriented parallel to each other.

The exemplary semiconductor structure shown in FIGS. 1A, 1B and 1C can be formed by first providing a semiconductor substrate. The semiconductor substrate includes at least one semiconductor material that has semiconducting properties. Examples of semiconductor materials that can be used as the semiconductor substrate include, for example, silicon (Si), a silicon germanium (SiGe) alloy, a silicon germanium carbide (SiGeC) alloy, germanium (Ge), III/V compound semiconductors or II/VI compound semiconductors. The semiconductor substrate is typically a bulk semiconductor substrate. The term "bulk semiconductor substrate" denotes a substrate that is composed entirely of one or more semiconductor materials. In one example, the bulk semiconductor substrate is composed entirely of Si.

The at least semiconductor material stack structures (MS1 and MS2) is then formed on the semiconductor substrate. As mentioned above, the at least one semiconductor material stack structure (MS1 and MS2) includes alternating layers of a sacrificial semiconductor material 12 and a semiconductor channel material 14 stacked one atop the other and such that each layer of a semiconductor channel material 14 is located between a bottom layer of sacrificial semiconductor material 12 and a top layer of sacrificial semiconductor material 12. In the drawings and by way of one example, the at least one semiconductor material stack structure (MS1 and MS2) includes four layers of sacrificial semiconductor material 12 and three layers of semiconductor channel material 14. The at least one semiconductor material stack structure (MS1 and MS2) that can be employed in the present application is not limited to the specific embodiment illustrated in FIGS. 1A, 1B and 1C. Instead, the at least one semiconductor material stack structure (MS1 and MS2) can include any number of layers of sacrificial semiconductor material 12 and corresponding layers of semiconductor channel material 14 provided that each layer of a semiconductor channel material 14 is located between a bottom layer of sacrificial semiconductor material 12 and a top layer of sacrificial semiconductor material 12.

Each layer of sacrificial semiconductor material 12 is composed of a first semiconductor material which differs in composition from at least an upper portion of the semiconductor substrate. In one embodiment, the upper portion of the semiconductor substrate is composed of silicon, while each layer of sacrificial semiconductor material 12 is composed of a silicon germanium alloy. The first semiconductor material that provides each layer of sacrificial semiconductor material 12 can be formed utilizing an epitaxial growth (or deposition process) as defined in greater detail herein below.

Each layer of semiconductor channel material 14 is composed of a second semiconductor material that has a different etch rate than the first semiconductor material that provides the first layers of sacrificial semiconductor material 12. The second semiconductor material that provides each layer of semiconductor channel material 14 may be the same as, or different from, the semiconductor material that provides at least the upper portion of the semiconductor substrate. In one example, at least the upper portion of the semiconductor substrate and each layer of semiconductor channel material 14 is composed of Si or a III-V compound semiconductor, while each layer of sacrificial semiconductor material 12 is composed of a silicon germanium alloy. The second semiconductor material that provides each layer of semiconductor channel material 14 can be formed utilizing an epitaxial growth (or deposition process) as defined in greater detail herein below.

The at least one semiconductor material stack structure (MS1 and MS2) can be formed by sequential epitaxial growth of alternating layers of the first semiconductor material and the second semiconductor material. Following epitaxial growth of the topmost layer of the at least one semiconductor material stack structure (MS1 and MS2) a patterning process may be used to provide the at least one semiconductor material stack structure (MS1 and MS2) shown in FIGS. 1A, 1B and 1C. Patterning may be performed by lithography and etching or any other patterning method known to those skilled in the art including, for example, a sidewall-image transfer (SIT) process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the first and second semiconductor materials that provide the layers of sacrificial semiconductor material 12 and the layers of semiconductor channel material 14, respectively, can be performed utilizing any well known precursor gas or gas mixture. Carrier gases like hydrogen, nitrogen, helium and argon can be used.

The term "semiconductor material stack structure" denotes a continuous fin-like structure including a pair of vertical sidewalls that are parallel to each other. As used herein, a surface is "vertical" if there exists a vertical plane from which the surface does not deviate by more than three times the root mean square roughness of the surface. Each layer of sacrificial semiconductor material 12 may have a thickness from 3 nm to 30 nm, while each layer of semiconductor channel material 14 may have a thickness from 3 nm to 20 nm. Each layer of sacrificial semiconductor material 12 may have a thickness that is the same as, or different from, a thickness of each layer of semiconductor channel material 14.

After forming the at least one semiconductor material stack structure (MS1 and MS2), the shallow trench isolation structure 16 is formed into an upper portion of the semiconductor substrate. The shallow trench isolation structure 16 can be formed by forming a trench into an upper portion of the semiconductor substrate and then filling the trench with a trench dielectric material such as, for example, silicon dioxide. A densification process may follow the trench fill. In some embodiments, an etch back process may follow the trench fill as well. In some embodiments, and as shown in FIGS. 1B and 1C, the shallow trench isolation structure 16 may have a topmost surface that is coplanar with a topmost surface of the semiconductor material pedestal region 10P. In other embodiments (not shown), the shallow trench isolation structure 16 may have a topmost surface that is higher or lower than a topmost surface of the semiconductor material pedestal region 10P.

The semiconductor material pedestal region 10P represents an upper portion of the semiconductor substrate that is not etched during the formation of the trench that will subsequently contain the shallow trench isolation structure 16. The base semiconductor material layer 10 represents a remaining portion of the semiconductor substrate that is located beneath the semiconductor material pedestal region 10P and the shallow trench isolation structure 16. In some embodiments, the semiconductor material pedestal region 10P and the base semiconductor material layer 10 are composed of a same semiconductor material. In such an instance, no material interface is present between the semiconductor material pedestal region 10P and base semiconductor material layer 10. In other embodiments, the semiconductor material pedestal region 10P and the base semiconductor material layer 10 are composed of different semiconductor materials. In such an instance, a material interface would exist between the semiconductor material pedestal region 10P and the base semiconductor material layer 10.

In some embodiments, the shallow trench isolation structure 16 may be formed prior to forming the least one semiconductor material stack structure (MS1 and MS2). Notwithstanding the order of forming the shallow trench isolation structure 16 and the least one semiconductor material stack structure (MS1 and MS2), the at least one semiconductor material stack structure (MS1 and MS2) may have sidewalls that are vertically aligned to the sidewalls of the semiconductor material pedestal region 10P.

Referring now to FIG. 2, there is illustrated the exemplary semiconductor structure of FIGS. 1A, 1B and 1C after forming a sacrificial gate material layer 18, a sacrificial gate hardmask layer 20, and a non-doped sacrificial pattern transfer patterning layer 22. In some embodiments (not shown), a sacrificial gate dielectric material layer may be formed prior to forming the sacrificial gate material layer 18.

When present, the sacrificial gate dielectric material layer can be composed of a dielectric oxide, nitride, and/or oxynitride. In one example, the sacrificial gate dielectric material layer can be composed of a high k material having a dielectric constant greater than silicon dioxide. In some embodiments, a multilayered dielectric structure comprising different dielectric materials, e.g., silicon dioxide, and a high k dielectric can be formed and used as the dielectric material that provides the sacrificial gate dielectric material layer. The sacrificial gate dielectric material layer can be formed by any deposition technique including, for example, chemical vapor deposition (CVD), plasma enhanced chemical vapor deposition (PECVD), physical vapor deposition (PVD), sputtering, or atomic layer deposition (ALD).

The sacrificial gate material layer 18 can be composed of a sacrificial gate material. The sacrificial gate material that provides the sacrificial gate material layer 18 can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material layer 18 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the sacrificial gate material layer 18, the sacrificial gate hardmask layer 20 can be formed. The sacrificial gate hardmask layer 20 may include a hardmask material such as, for example, silicon dioxide and/or silicon nitride. The sacrificial gate hardmask layer 20 can be formed by any suitable deposition process such as, for example, chemical vapor deposition (CVD) or plasma enhanced chemical vapor deposition (PECVD).

After forming the sacrificial gate hardmask layer 20, a non-doped sacrificial pattern transfer patterning layer 22 is formed. In some embodiments, the non-doped sacrificial pattern transfer patterning layer 22 may be composed of amorphous silicon. In other embodiments, the non-doped sacrificial pattern transfer patterning layer 22 may be composed of polycrystalline silicon. The non-doped sacrificial pattern transfer patterning layer 22 may be formed utilizing a deposition process such as, for example, chemical vapor deposition (CVD), plasma enhanced chemical vapor deposition (PECVD), physical vapor deposition (PVD), sputtering, or atomic layer deposition (ALD).

Referring now to FIG. 3, there is illustrated the exemplary semiconductor structure of FIG. 2 after introducing a p-type dopant into the non-doped sacrificial pattern transfer patterning layer 22 that is located over the shallow trench isolation structure 16 to provide a p-doped sacrificial pattern transfer patterning layer 24, while maintaining the non-doped sacrificial pattern transfer patterning layer 22 over the semiconductor material pedestal region 10P.

The p-doped sacrificial pattern transfer patterning layer 24 may be formed by forming a mask (not shown) over the non-doped sacrificial pattern transfer patterning layer 22 that is located over the semiconductor material pedestal region 10P. The mask may be composed of a photoresist material which is deposited as a blanket layer and then patterned by photolithography. With the mask present over the non-doped sacrificial pattern transfer patterning layer 22 that is located over the semiconductor material pedestal region 10P, a p-type dopant is introduced into the unmasked portions of the non-doped sacrificial pattern transfer patterning layer 22 transforming the unmasked portions of the non-doped sacrificial pattern transfer patterning layer 22 into the p-type doped sacrificial pattern transfer patterning layer 24. The introducing of the p-type dopant may be performed by ion implantation or gas phase doping. The mask is removed utilizing a material removal process such as, for example, stripping or ashing.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In one example, the p-doped sacrificial pattern transfer patterning layer 24 is composed of amorphous silicon that is doped with boron. In another example, the p-doped sacrificial pattern transfer patterning layer 24 is composed of polycrystalline silicon that is doped with boron. The amount, i.e., concentration of p-type dopant that is present in the p-type doped sacrificial pattern transfer patterning layer 24 may be from $1 \times 10^{19}$ atoms/cm$^3$ to $3 \times 10^{21}$ atoms/cm$^3$. The p-doped sacrificial pattern transfer patterning layer 24 has a lower lateral etch rate than the non-doped sacrificial pattern transfer patterning layer 22.

In an alternative embodiment, and instead of using a non-doped sacrificial pattern transfer patterning layer 22 over the active region and a p-type sacrificial pattern transfer patterning layer 24 over the isolation region, an n-type doped sacrificial pattern transfer patterning layer (i.e., n-type amorphous or polycrystalline silicon) can be formed over the active region, and a non-doped sacrificial pattern transfer patterning layer (i.e., non-doped amorphous or polycrystalline silicon) can be formed over the isolation region. The lateral etch rate of an n-type doped sacrificial pattern transfer patterning layer is faster than a non-doped sacrificial pattern transfer patterning layer. In such an embodiment, a non-doped sacrificial pattern transfer patterning layer 22 is formed over the sacrificial gate hardmask layer 20. A mask can then be applied to cover the non-doped sacrificial pattern transfer patterning layer 22 over the isolation region, and thereafter an n-type dopant can be introduced into the non-covered portion of the non-doped sacrificial pattern transfer patterning layer 22 that is located over the active region. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The amount, i.e., concentration of n-type dopant that is present in the n-type doped sacrificial pattern transfer patterning layer that can be formed over the active region may be from $1 \times 10^{19}$ atoms/cm$^3$ to $3 \times 10^{21}$ atoms/cm$^3$. The n-type doped sacrificial pattern transfer patterning layer has a higher lateral etch rate than the non-doped sacrificial pattern transfer patterning layer.

Figure 4:
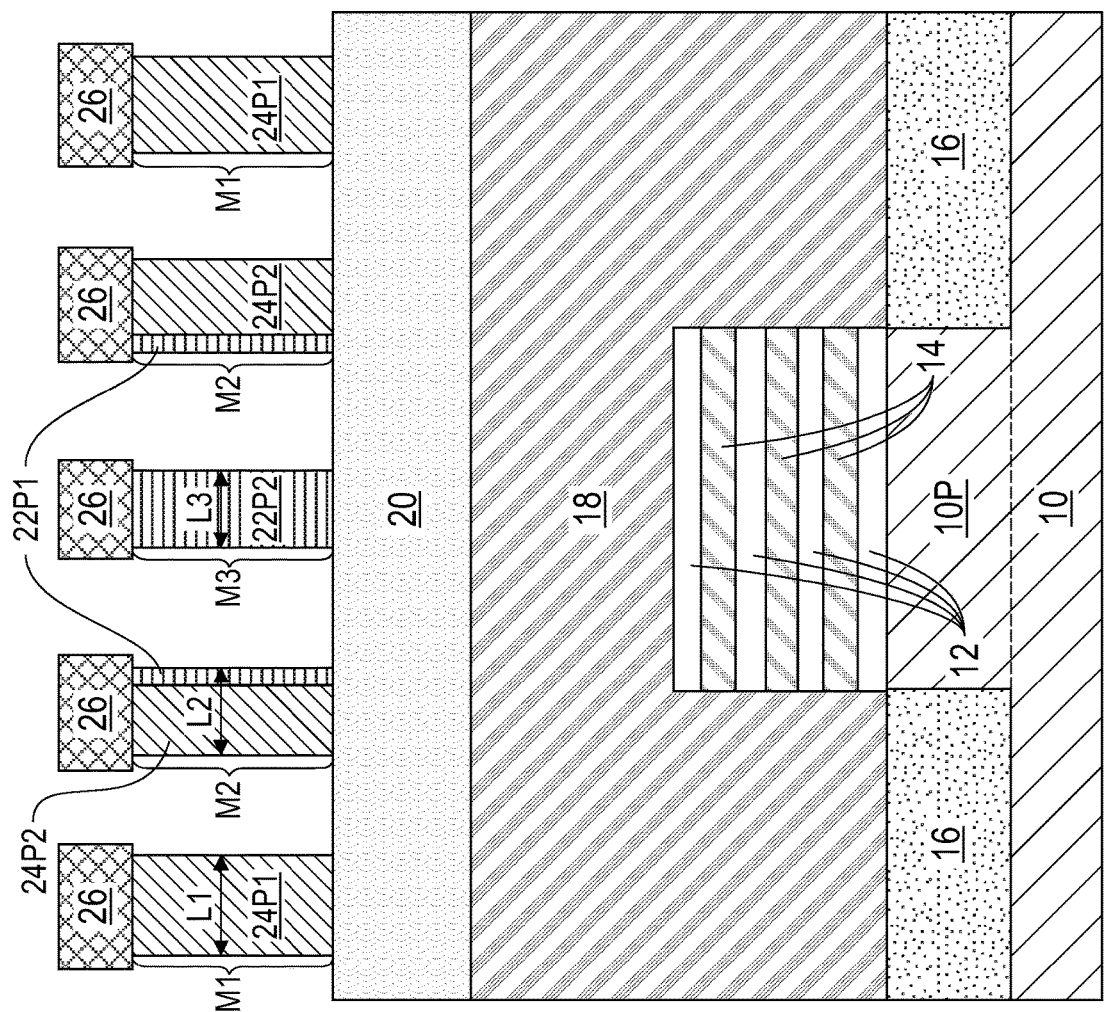
FIG. 4 is a cross sectional view of the exemplary semiconductor structure of FIG. 3 after forming patterned gate masks on the p-doped sacrificial pattern transfer patterning layer and the non-doped sacrificial pattern transfer patterning layer, and performing a first reactive ion etching process to provide sacrificial patterning transfer masks located between the patterned gate masks and the sacrificial gate hardmask layer, wherein the sacrificial patterning transfer mask located over the shallow trench isolation structure has a length that is greater than the sacrificial patterning transfer mask that is located over the semiconductor material pedestal region.

Referring now to FIG. 4, there is shown the exemplary semiconductor structure of FIG. 3 after forming patterned gate masks 26 on the p-doped sacrificial pattern transfer patterning layer 24 and the non-doped sacrificial pattern transfer patterning layer 22. The patterned gate masks 26 may be composed of a photoresist material that can be formed by deposition and photolithography. In some embodiments, the lateral width of each patterned gate mask 26 is substantially the same. Furthermore, the spacing between adjacent patterned gate masks 26 is substantially the same. In other words, the gate pitch (i.e., the sum of the lateral width of each patterned gate mask 26 and the spacing between adjacent patterned gate masks 26) is substantially the same. The 'same' pitch advantageously improves the process margin and the patterning fidelity. The term "substantially the same" denotes that a value is less than ±5 percent from another value.

After forming the patterned gate masks 26, a first reactive ion etching process is performed to remove physically exposed portions of the underlying p-doped sacrificial pattern transfer patterning layer 24 and the non-doped sacrificial pattern transfer patterning layer 22 that are not protected by the patterned gate masks 26. The first reactive ion etch provides sacrificial patterning transfer masks (M1, M2, M3) located between the patterned gate masks 26 and the sacrificial gate hardmask layer 20. In accordance with the present application, the sacrificial patterning transfer mask (i.e., first sacrificial patterning transfer mask M1) that is located over the shallow trench isolation structure 16 has a length, L1, that is greater than a length, L3, of the sacrificial patterning transfer mask (i.e., the third sacrificial patterning transfer mask M3) that is located over the semiconductor material pedestal region 10P. A second sacrificial patterning transfer mask M2 can be formed between the first sacrificial patterning transfer mask M1 and the third sacrificial patterning transfer mask M3. The second sacrificial patterning transfer mask M2 is partially located over the shallow trench isolation structure 16 and partially over the semiconductor material pedestal region 10P (this region is referred to herein as a 'transition region'). The second sacrificial patterning transfer mask M2 has a length, L2, that is less than L1, but greater than L3. In some embodiments, the second sacrificial patterning transfer mask M2 is not formed.

Stated in other terms, and due to higher lateral etch rate of the non-doped sacrificial pattern transfer patterning layer 22 compared to the p-doped sacrificial pattern transfer patterning layer 24, the third sacrificial patterning transfer mask M3 has a narrower length, L3, in the active region, as compared to the length, L1, of the first sacrificial patterning transfer mask M1 in the isolation region. In the transition region, the second sacrificial patterning transfer mask M2 has a length, L2, which is between L1 and L3.

As is shown, the first patterning transfer mask M1 is composed entirely of a remaining portion of the p-doped sacrificial pattern transfer patterning layer 24. The remaining portion of the p-doped sacrificial pattern transfer patterning layer 24 that constitutes the first patterning transfer mask M1 is referred to herein as a first p-type sacrificial pattern transfer patterning layer portion 24P1.

The second patterning transfer mask M2 is composed of a remaining portion of the p-doped sacrificial pattern transfer patterning layer 24 and a remaining portion of the non-doped sacrificial pattern transfer patterning layer 22. The remaining portion of the p-doped sacrificial pattern transfer patterning layer 24 that constitutes the second patterning transfer mask M2 is referred to herein as a second p-type sacrificial pattern transfer patterning layer portion 24P2, while the remaining portion of the non-doped sacrificial pattern transfer patterning layer 22 that constitutes the second patterning transfer mask M2 is referred to herein as a first non-doped sacrificial pattern transfer patterning layer portion 22P1.

The third patterning transfer mask M3 is composed entirely of a remaining portion of the non-doped sacrificial pattern transfer patterning layer 22. The remaining portion of the non-doped sacrificial pattern transfer patterning layer 22 that constitutes the third patterning transfer mask M3 is referred to herein as a second non-doped sacrificial pattern transfer patterning layer portion 24P2.

Figure 5:
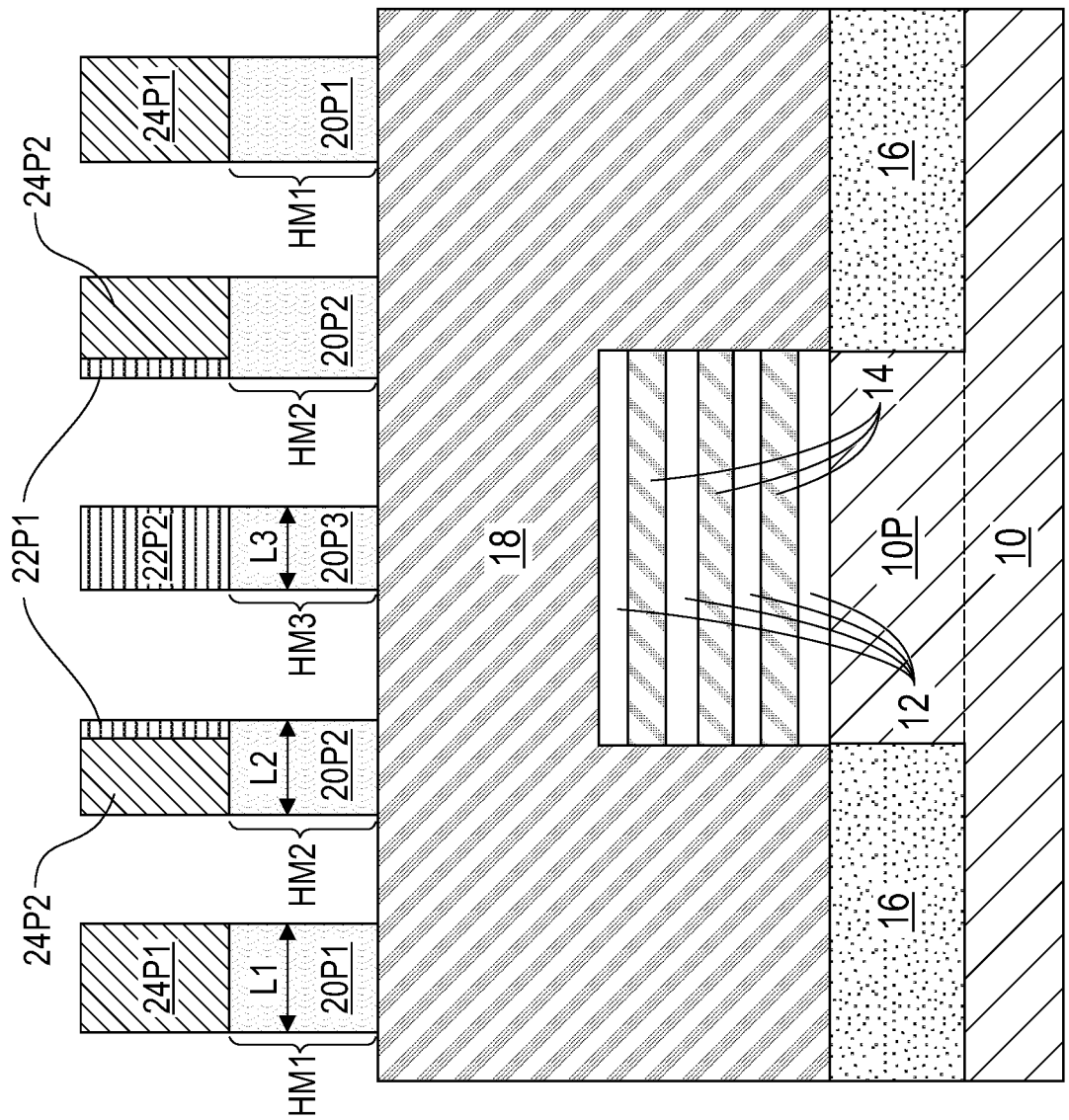
FIG. 5 is a cross sectional view of the exemplary semiconductor structure of FIG. 4 after removing the patterned gate masks, and performing a second reactive ion etching process to provide patterned sacrificial hardmasks, wherein the patterned sacrificial hardmask that is located over the shallow trench isolation structure has a length that is greater than a length of the patterned sacrificial hardmask that is located over the semiconductor material pedestal region.

Referring now to FIG. 5, there is illustrated the exemplary semiconductor structure of FIG. 4 after removing the patterned gate masks 26. The patterned gate masks 26 may be removed utilizing a material removal process such as, for example, stripping or ashing. After removing the patterned gate masks 26, a second reactive ion etching process is performed to remove physically exposed portions of the sacrificial gate hardmask layer 20 that are not protected by the patterning transfer masks M1, M2 and M3. The second reactive ion etch provides patterned sacrificial hardmasks, HM1, HM2 and HM3. In accordance with the present application, the patterned sacrificial hardmask (i.e., the first patterned sacrificial hardmask HM1) that is located over the shallow trench isolation structure 16 has a length L1 that is greater than a length L3 of the patterned sacrificial hardmask (i.e., the third patterned sacrificial hardmask HM3) that is located over the semiconductor material pedestal region 10P. A second patterned sacrificial hardmask HM2 can be formed in the transition region and between the first patterned sacrificial hardmask HM1 and the third patterned sacrificial hardmask HM3. The second patterned sacrificial hardmask HM2 has a length, L2, that is less than L1, but greater than L3. In some embodiments, the second patterned sacrificial hardmask HM2 is not formed.

As is shown, the first patterned sacrificial hardmask HM1 is composed of a remaining portion of the sacrificial gate hardmask layer 20 that is present beneath the first patterning transfer mask M1. The remaining portion of the of the sacrificial gate hardmask layer 20 that constitutes the first patterned sacrificial hardmask HM1 is referred to herein as a first sacrificial gate hardmask cap 20P1. The second patterned sacrificial hardmask HM2 is composed of a remaining portion of the sacrificial gate hardmask layer 20 that is present beneath the second patterning transfer mask M2. The remaining portion of the of the sacrificial gate hardmask layer 20 that constitutes the second patterned sacrificial hardmask HM2 is referred to herein as a second sacrificial gate hardmask cap 20P2. The third patterned sacrificial hardmask HM3 is composed of a remaining portion of the sacrificial gate hardmask layer 20 that is present beneath the third patterning transfer mask M3. The remaining portion of the of the sacrificial gate hardmask layer 20 that constitutes the third patterned sacrificial hardmask HM3 is referred to herein as a third sacrificial gate hardmask cap 20P3.

Figure 6:
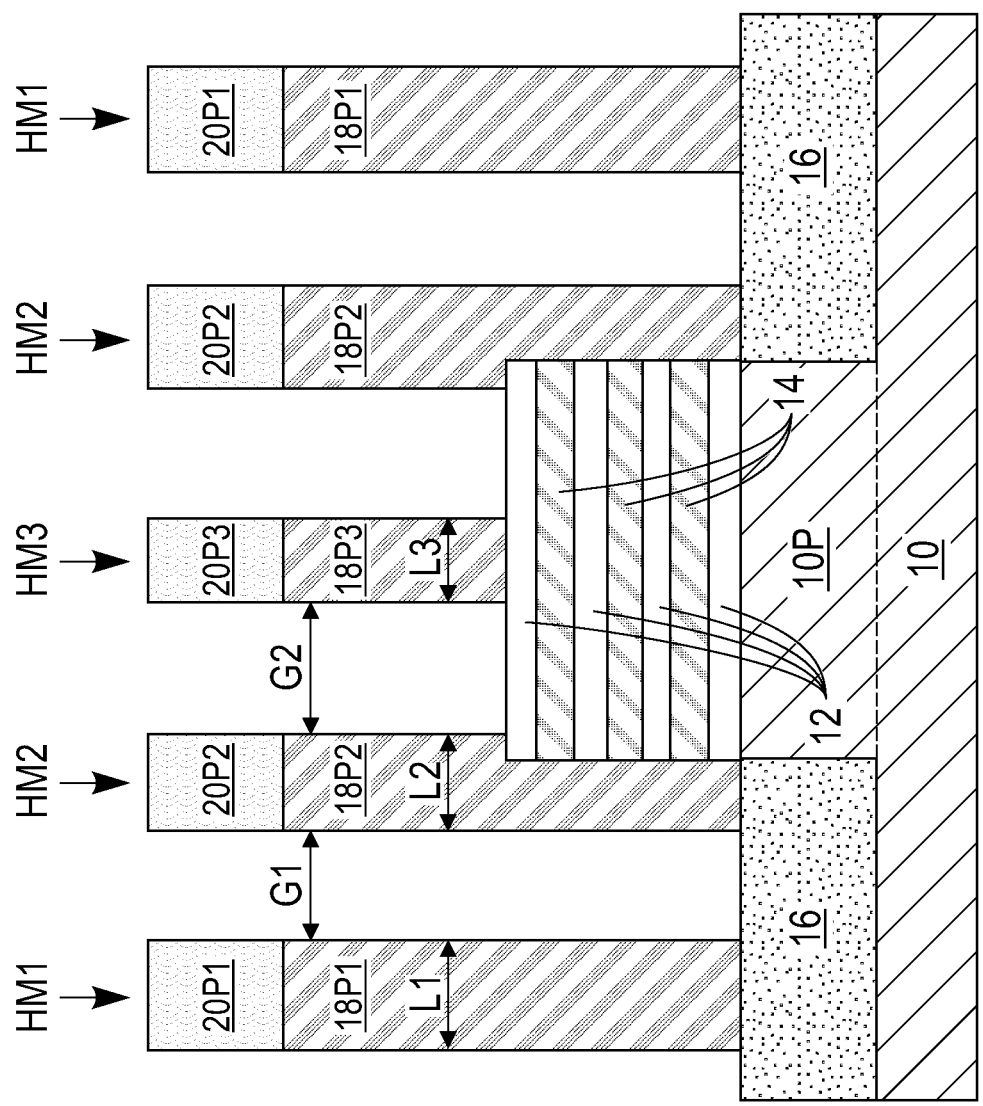
FIG. 6 is a cross sectional view of the exemplary semiconductor structure of FIG. 5 after performing a third reactive ion etching process to provide sacrificial gate structures, wherein the sacrificial gate structure located over the shallow trench isolation structure has a length that is greater than a length of the sacrificial gate structure that is located over the semiconductor material pedestal region.

Referring now to FIG. 6, there is illustrated the exemplary semiconductor structure of FIG. 5 after performing a third reactive ion etching process. In some embodiments, the third reactive ion etching steps also removes each patterning transfer mask M1, M2 and M3 from the structure. In other embodiments, a separate material removal process can be used to remove each patterning transfer mask M1, M2 and M3 from the structure prior to performing the third reactive ion.

The third reactive ion etch removes portions of the underlying sacrificial gate material layer 18 that are not protected by a patterned sacrificial gate hardmask HM1, HM2 and HM3. The third reactive ion etch provides sacrificial gate structures. In accordance with the present application, the sacrificial gate structure (i.e., the first sacrificial gate structure 18P1) located over the shallow trench isolation structure 16 has a length L1 that is greater than a length L2 of the sacrificial gate structure (i.e., the third sacrificial gate structure 18P3) that is located over the semiconductor material pedestal region 10P. A second sacrificial gate structure 18P2 can be formed in the transition region and between the first sacrificial gate structure 18P1 and the third sacrificial gate structure 18P3. The second sacrificial gate structure 18P2 has a length, L2, that is less than L1, but greater than L3. In some embodiments, the second sacrificial gate structure 18P2 is not formed.

It is noted that although the third sacrificial gate structure 18P3 is shown as being formed atop the at least one semiconductor material stack structure (12/14), the third sacrificial gate structure 18P3 is also located on each side of the at least one semiconductor material stack structure (12/14). Thus, the third sacrificial gate structure 18P3 straddles over a middle portion of the at least one semiconductor material stack structure (12/14). Likewise, a portion of the second gate structure 18P2 that is closest to the third sacrificial gate structure 18P3 is also located on each side of the at least one semiconductor material stack structure (12/14). Thus, the second sacrificial gate structure 18P2 straddles over the end portion of the at least one semiconductor material stack structure (12/14).

The first sacrificial gate structures 18P1 that are present over the shallow trench isolation structure 16 reduce aspect ratio (as composed to the second and third sacrificial gate structures) thus avoiding the collapsing issue discussed above. The second and third sacrificial gate structures (18P2 and 18P3) are anchored by the at least one semiconductor material stack structure (12/14) so gate collapsing is not an issue.

As is shown in FIG. 6, the spacing, G1, between the first sacrificial gate structure 18P1 and the second sacrificial gate structure 18P2 is less than the spacing, G2, between the second sacrificial gate structure 18P2 and third sacrificial gate structure 18P3.

Figure 7:
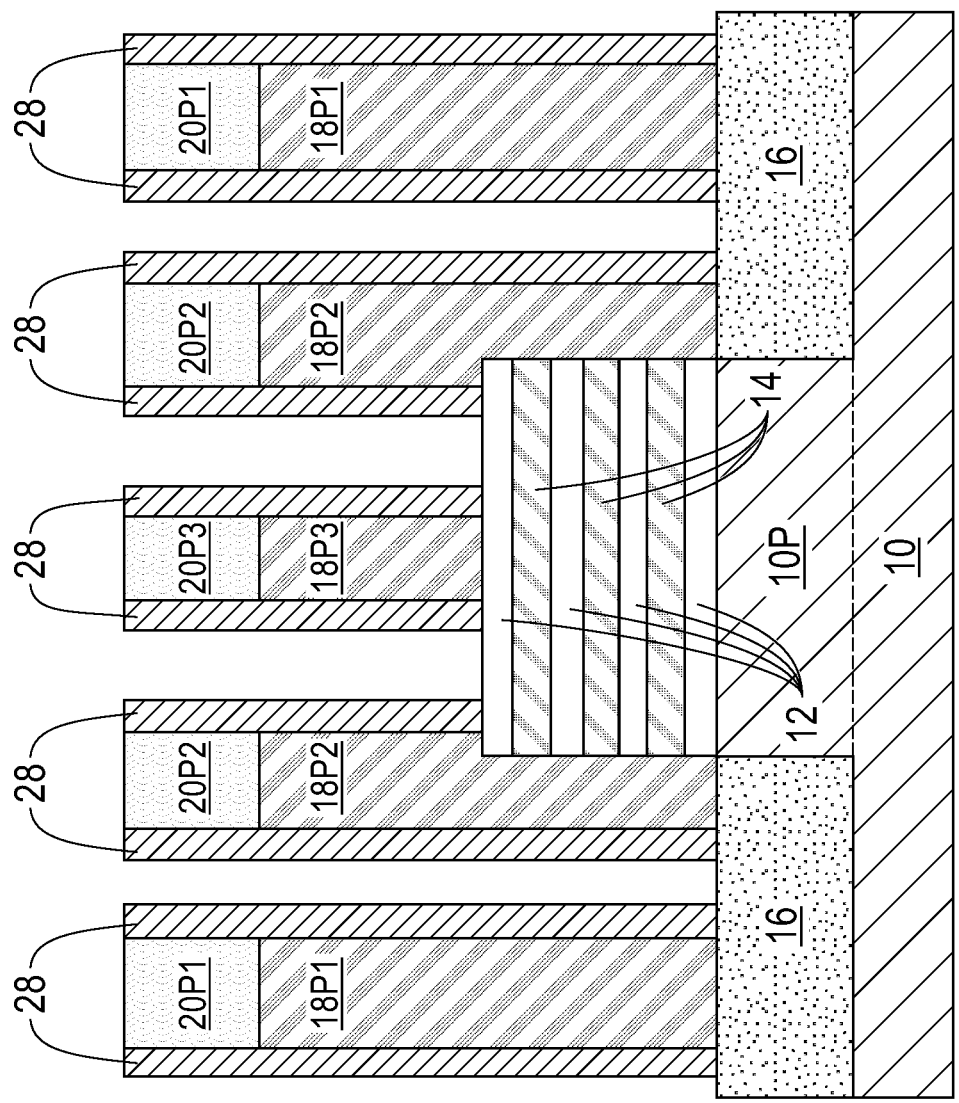
FIG. 7 is a cross sectional view of the exemplary semiconductor structure of FIG. 6 after forming a dielectric spacer on physically exposed sidewalls of each sacrificial gate structure and each patterned sacrificial gate hardmask.

Referring now to FIG. 7, there is illustrated the exemplary semiconductor structure of FIG. 6 after forming a dielectric spacer 28 on physically exposed sidewalls of each sacrificial gate structure (18P1, 18P2 and 18P3) and each patterned sacrificial gate hardmask (HM1, HM2 and HM3). In this drawing and the remaining drawing, HM1 can now be referred to as the first sacrificial gate hardmask cap 20P1, HM2 can now be referred to as the second sacrificial gate hardmask cap 20P2, and HM3 can now be referred to as the third sacrificial gate hardmask cap 20P3.

The dielectric spacer 28 can be formed by first providing a dielectric spacer material and then etching the dielectric spacer material. Examples of dielectric spacer materials that may be employed in the present application are siliconboron carbonitride (SiBCN), or silicon oxycarbonitride (SiOCN). The dielectric spacer material that provides the dielectric spacer 28 may be provided by a deposition process including, for example, chemical vapor deposition (CVD), plasma enhanced chemical vapor deposition (PECVD), atomic layer deposition (ALD) or physical vapor deposition (PVD). The etch used to provide the dielectric spacer 28 may comprise a dry etching process such as, for example, reactive ion etching. It noted that the dielectric spacer 28 that is formed above the at least one semiconductor material stack structure (12/14) also straddles over the at least one semiconductor material stack structure (12/14).

Figure 8:
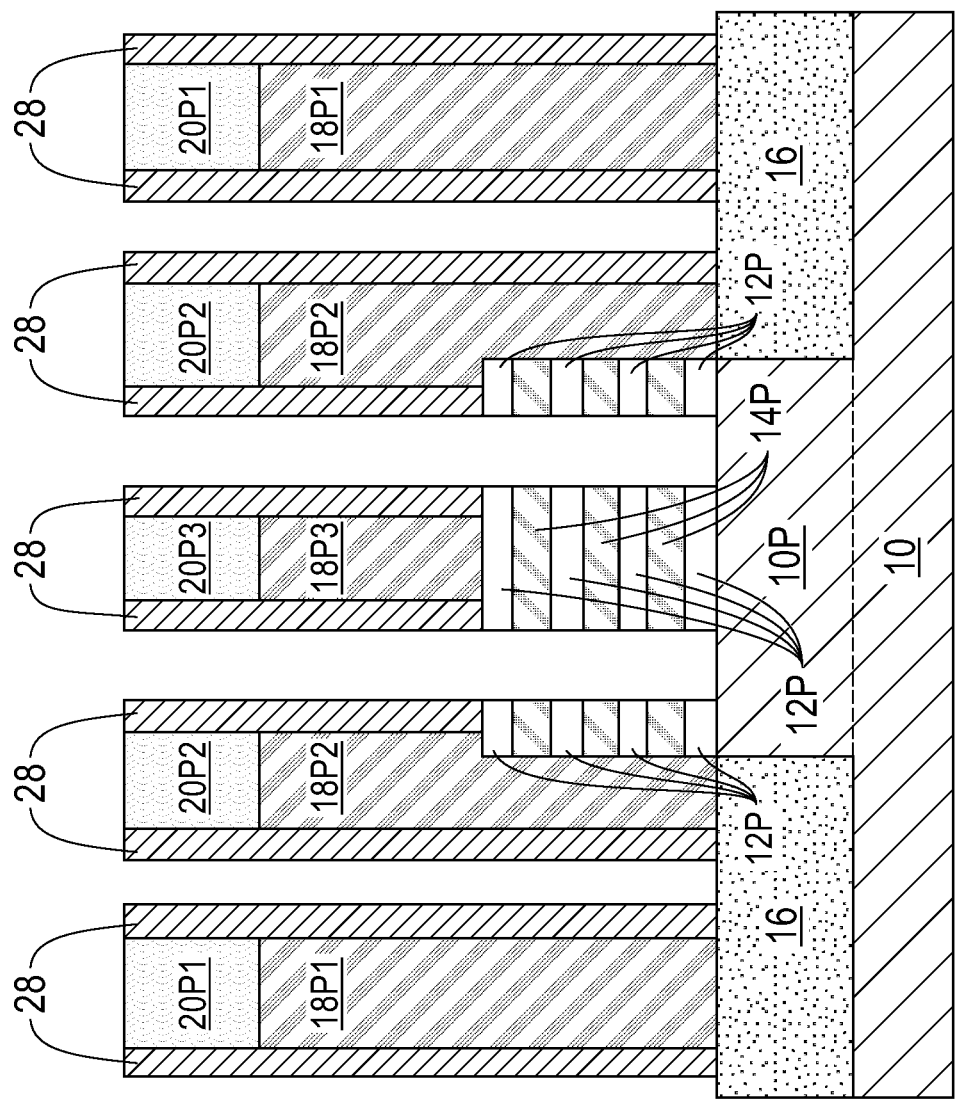
FIG. 8 is a cross sectional view of the exemplary semiconductor structure of FIG. 7 after recessing physically exposed portions of the at least one semiconductor material stack structure to provide at least one nanosheet material stack of alternating nanosheets of sacrificial semiconductor material and semiconductor channel material located beneath the sacrificial gate structure located over the semiconductor material pedestal region.

Referring now to FIG. 8, there is illustrated the exemplary semiconductor structure of FIG. 7 after recessing physically exposed portions of the at least one semiconductor material stack structure (12/14) to provide at least one nanosheet material stack of alternating nanosheets of sacrificial semiconductor material and semiconductor channel material located beneath the second and third sacrificial gate structures (18P2 and 18P3) that are located over the semiconductor material pedestal region 18P. In the drawings, element 12P represents a sacrificial semiconductor material nanosheet and element 14P represents a semiconductor channel material nanosheet. The nanosheet stack that is present in the transition region extends partially through the second sacrificial gate structure 18P2, while the nanosheet stack that is present in the active region (i.e., over the semiconductor material pedestal region 10P) extends entirely through the third sacrificial gate structure 18C.

The removal of the physically exposed portions of the at least one semiconductor material stack structure (12/14) not covered by the second and third sacrificial gate structures (18P2 and 18P3) and the dielectric spacer 28 can be performed utilizing an anisotropic etching process such as, for example, reactive ion etching (RIE).

Each nanosheet, i.e., sacrificial semiconductor material nanosheet 12P and semiconductor channel material nanosheet 14P has a thickness as mentioned above for the layers of sacrificial semiconductor material 12 and semiconductor channel material 14, a length from 10 nm to several μms, and a width (into the page) from 5 nm to 150 nm. At this point of the present application and as illustrated in FIG. 8, the sidewalls of each sacrificial semiconductor material nanosheet 12P are vertically aligned to sidewalls of each semiconductor channel material nanosheet 14P, and the vertically aligned sidewalls of the nanosheet material stack are vertically aligned to an outmost sidewall of the dielectric spacer 28.

Figure 9:
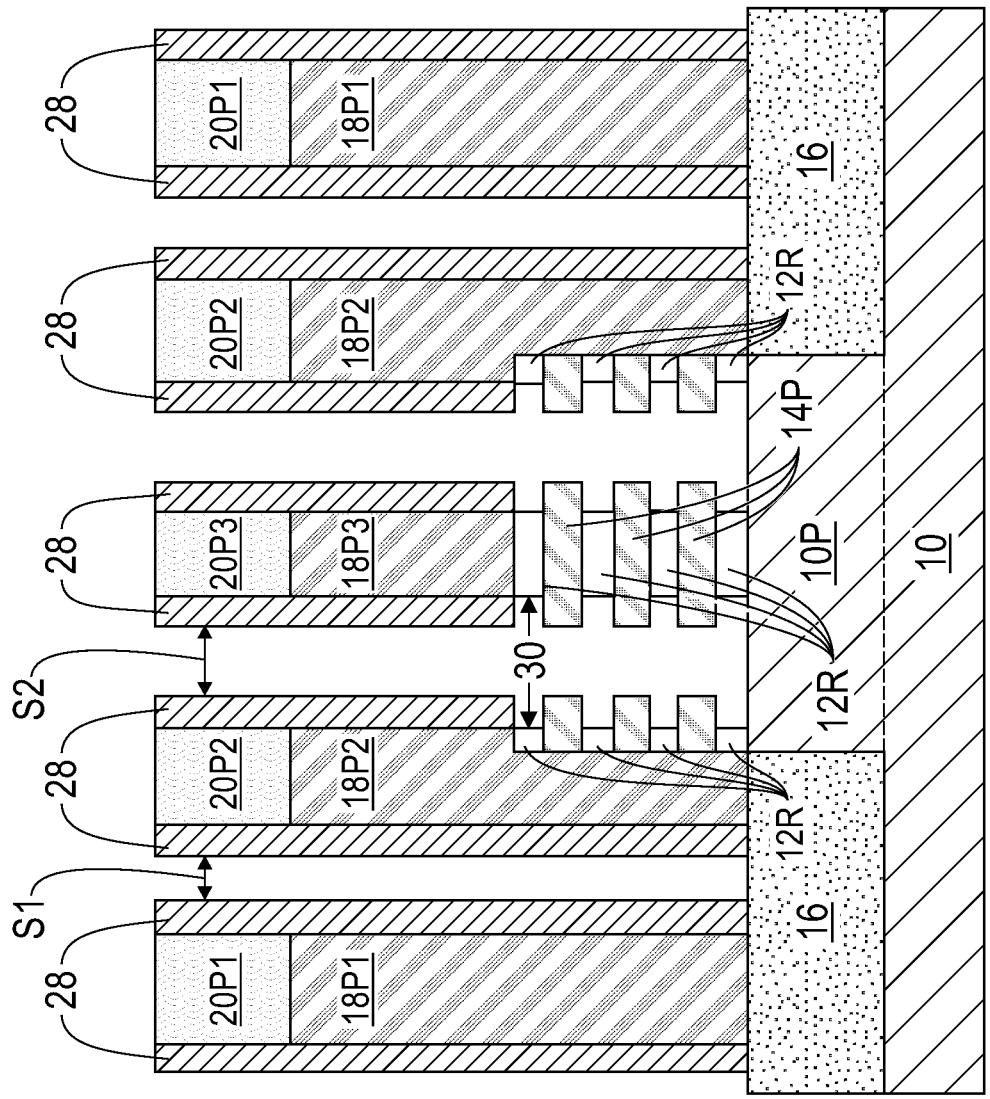
FIG. 9 is a cross sectional view of the exemplary semiconductor structure of FIG. 8 after laterally etching each sacrificial semiconductor material nanosheet to provide a gap located above and below each semiconductor channel material nanosheet.

Referring now to FIG. 9, there is illustrated the exemplary semiconductor structure of FIG. 8 after laterally etching each sacrificial semiconductor material nanosheet 12P to provide a gap 30 located above and below each semiconductor channel material nanosheet 14P. Each laterally etched sacrificial semiconductor material nanosheet 12P is referred to herein as a recessed sacrificial semiconductor material nanosheet 12R. Each recessed sacrificial semiconductor material nanosheet 12R has a length that is less than the original length of each sacrificial semiconductor material nanosheet 12P. The recessing of each sacrificial semiconductor material nanosheet 12P may be performed utilizing a lateral etching process that is selective in removing physically exposed end portions of each sacrificial semiconductor material nanosheet 12P relative to each semiconductor channel material nanosheet 14P.

It is noted that due to the different gate lengths in the active region (defined by the semiconductor material pedestal region 10P) and the isolation region (defined by the shallow trench isolation structure 16), the adjacent gate spacing, S1, in the isolation region is narrower than the adjacent gate spacing, S2, in the active region.

Figure 10:
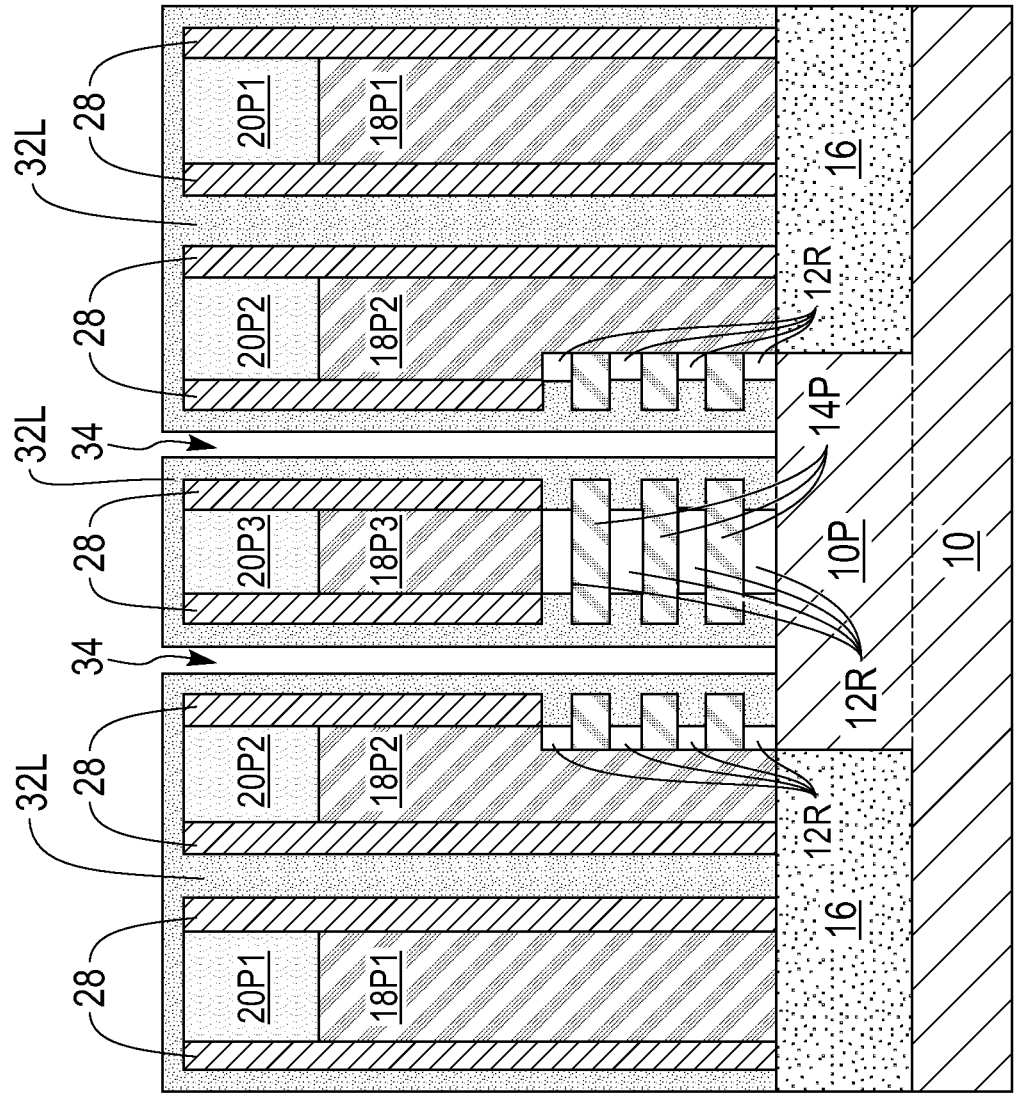
FIG. 10 is a cross sectional view of the exemplary semiconductor structure of FIG. 9 after forming an inner dielectric spacer layer, wherein the inner dielectric spacer layer completely fills in each gap located above and below each semiconductor channel material nanosheet, and completely fills in the spacing between the sacrificial gate structures located over the shallow trench isolation structures, while leaving an opening in the spacing between each sacrificial gate structure located over the semiconductor material pedestal region.

Referring now to FIG. 10, there is illustrated the exemplary semiconductor structure of FIG. 9 after forming an inner dielectric spacer layer 32L, wherein the inner dielectric spacer layer 32L completely fills in each gap 30 located above and below each semiconductor channel material nanosheet, and completely fills in the spacing, S1, between the sacrificial gate structures (18P1 and 18P2) located over the shallow trench isolation structures 16, while leaving an opening 34 in the spacing, S2, between each sacrificial gate structure (18P2 and 18P3) located over the semiconductor material pedestal region 10P. The inner dielectric spacer layer 32L may be composed of a dielectric spacer material that differs in composition from dielectric spacer 28. In one example, the inner dielectric spacer layer is composed of silicon nitride. The inner dielectric spacer layer 32L can be formed utilizing a conformal deposition process such as, for example, chemical vapor deposition (CVD) or plasma enhanced chemical vapor deposition (PECVD).

Figure 11:
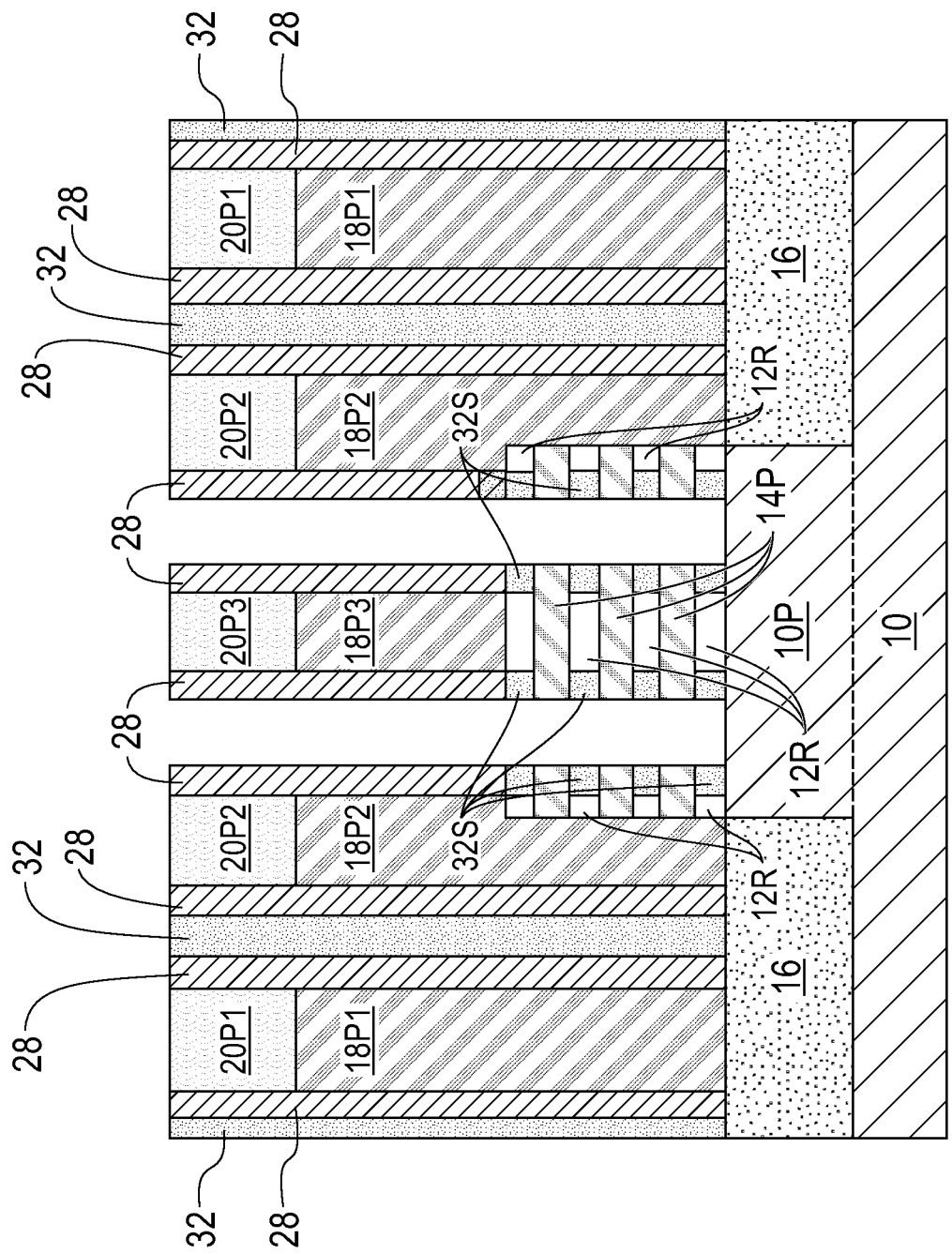
FIG. 11 is a cross sectional view of the exemplary semiconductor structure of FIG. 10 after performing an inner dielectric spacer layer etch back process.

Referring now to FIG. 11, there is illustrated the exemplary semiconductor structure of FIG. 10 after performing an inner dielectric spacer layer etch back process. The inner dielectric spacer layer etch back removes the inner dielectric spacer layer 32L that is located above each sacrificial gate structure (18P1, 18P2 and 18P3) and each dielectric spacer 28. The inner dielectric spacer layer etch back forms inner dielectric spacer 32S in gaps 30 which contact end portions of each recessed sacrificial semiconductor material nanosheet 12R. The inner dielectric spacer layer etch back maintains inner dielectric spacer material within the spacing S1 providing anchoring dielectric spacer 32 in the isolation region of the structure. The anchoring dielectric spacer 32 serves as an anchor for the first sacrificial gate structure 18P1. The anchoring dielectric spacer 32 has a topmost surface that is coplanar with a topmost surface of dielectric spacer 28. Alternatively, any over etch of the etch back process will cause the topmost surface of the anchoring dielectric spacer 32 to be below the topmost surface of the dielectric spacer 28. The anchoring dielectric spacer 32 is located between the first and second sacrificial gate structures (18P1 and 18P2) and directly contacts a dielectric spacer 28 that is located on a sidewall of the first and second gate structures (18P1, 18P2).

Figure 12:
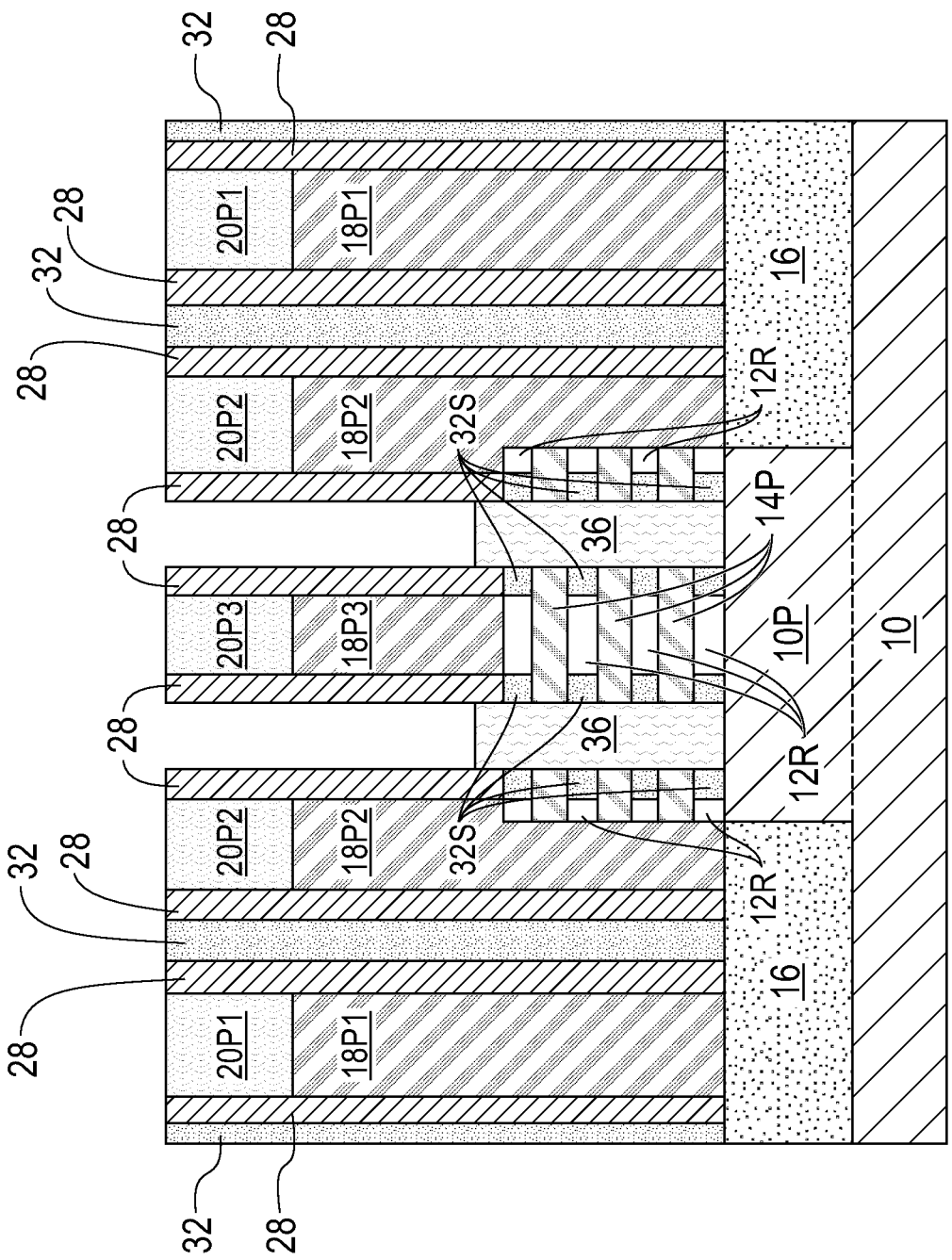
FIG. 12 is a cross sectional view of the exemplary semiconductor structure of FIG. 11 after epitaxially growing a source/drain structure from physically exposed sidewalls of each semiconductor channel material nanosheet.

Referring now to FIG. 12, there is illustrated the exemplary semiconductor structure of FIG. 11 after epitaxially growing a source/drain structure 36 from physically exposed sidewalls of each semiconductor channel material nanosheet 14P.

Each source/drain (S/D) structure 36 is composed of a doped semiconductor material and is epitaxially grown on the physically exposed sidewall of each of the semiconductor channel material nanosheet 14P. The S/D structures 36 have a bottommost surface that directly contacts a topmost surface of the semiconductor material pedestal region 10P. In some embodiments (not shown), each S/D structure 36 has a faceted upper surface.

Each S/D structure 36 includes a semiconductor material and a dopant. The semiconductor material that provides each S/D structure 36 can be selected from one of the semiconductor materials mentioned above for the semiconductor substrate. In some embodiments, the semiconductor material that provides each S/D structure 36 may comprise a same semiconductor material as that which provides each semiconductor channel material nanosheet 14P. In other embodiments of the present application, the semiconductor material that provides each S/D structure 36 may comprise a different semiconductor material than that which provides each semiconductor channel material nanosheet 14P. For example, the semiconductor material that provides each S/D structure 36 may be composed of silicon germanium alloy, while each semiconductor channel material nanosheet 14P may be composed of silicon.

The dopant that is present in each S/D structure 36 can be either a p-type dopant or an n-type dopant. The terms "p-type" and "n-type" were previously defined in the present application. In one example, the doped semiconductor material provides each S/D structure 36 comprises silicon or a silicon germanium alloy that has a dopant concentration of from $1\times10^{19}$ atoms/cm$^3$ to $5\times10^{21}$ atoms/cm$^3$.

In one embodiment, the dopant that can be present in the each S/D structure 36 can be introduced into the precursor gas that provides each S/D structure 36. In another embodiment, the dopant can be introduced into an intrinsic semiconductor layer by utilizing one of ion implantation or gas phase doping. As mentioned above, each S/D structure 36 is formed by an epitaxial growth (or deposition) process, as is defined above.

Figure 13:
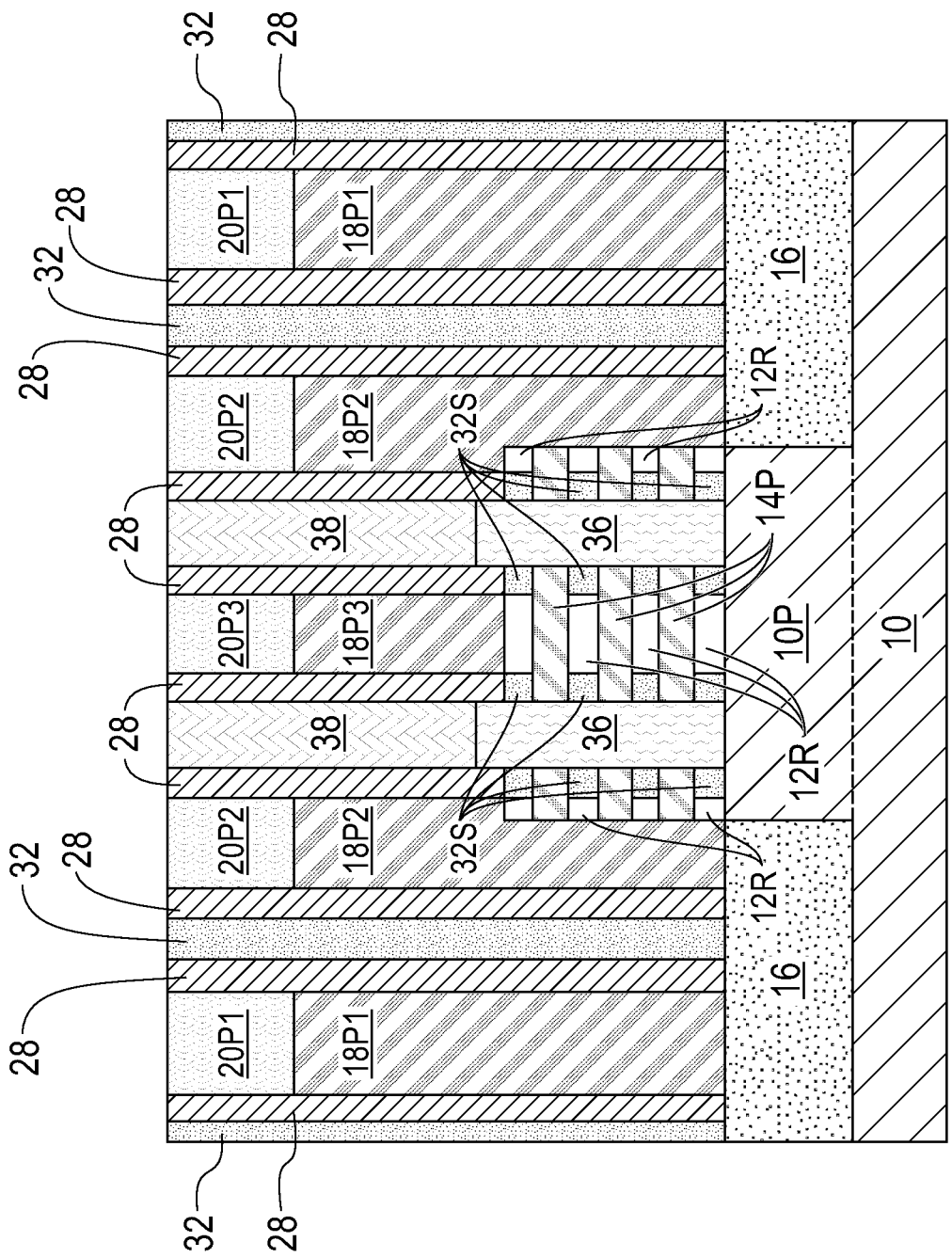
FIG. 13 is a cross sectional view of the exemplary semiconductor structure of FIG. 12 after forming an inter-level dielectric material on a topmost surface of each source/drain structure.

Referring now to FIG. 13, there is illustrated the exemplary semiconductor structure of FIG. 12 after forming an interlevel dielectric (ILD) material 38 on a topmost surface of each source/drain structure 36. The ILD material layer 38 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 38. The use of a self-planarizing dielectric material as the ILD material layer 38 may avoid the need to perform a subsequent planarizing step. Although not shown, and in some embodiments, a dielectric liner (e.g., silicon nitride) can be deposited prior to the ILD material 38.

In one embodiment, the ILD material layer 38 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 38, a planarization process or an etch back process follows the deposition of the dielectric material that provides the ILD material layer 38.

Figure 14:
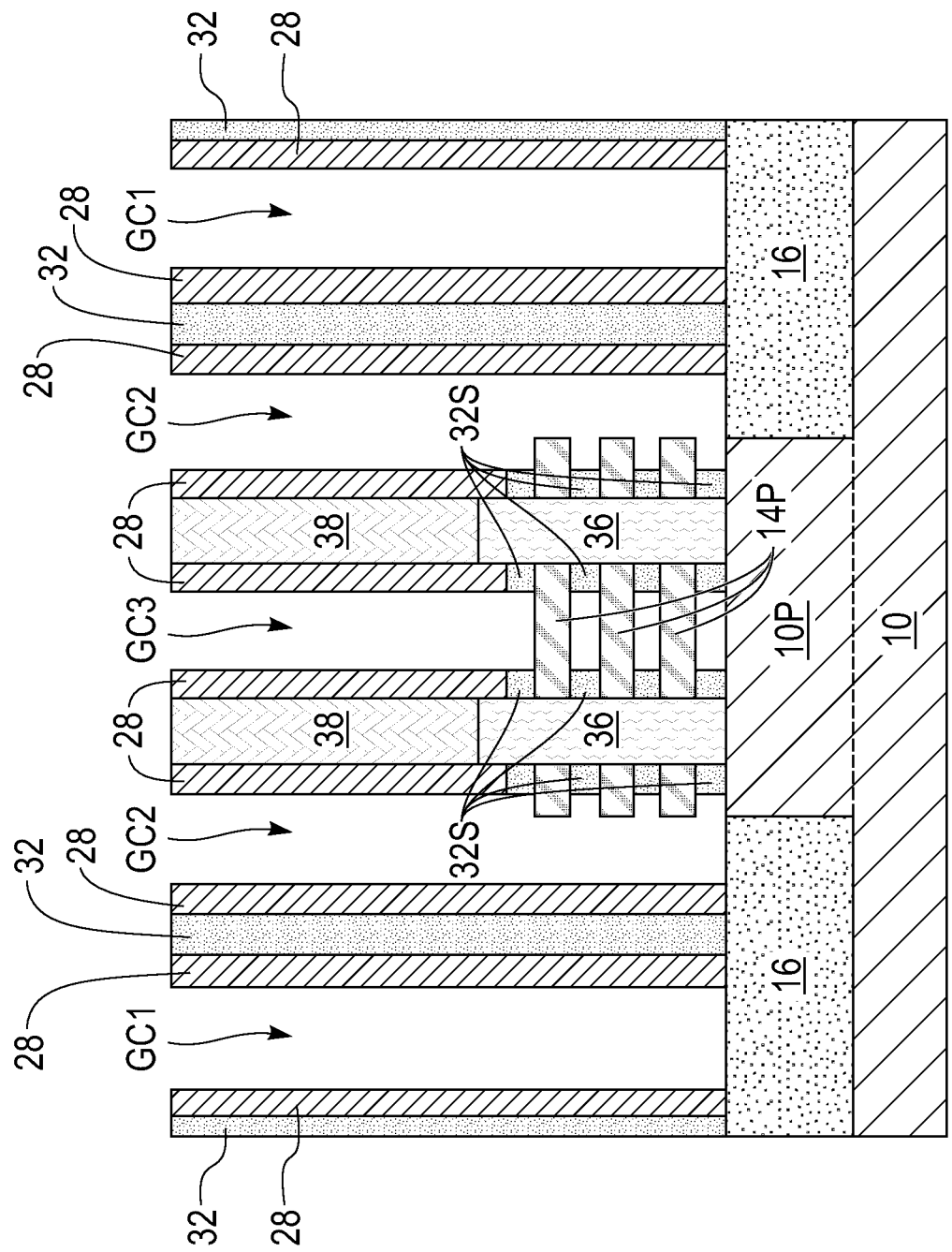
FIG. 14 is a cross sectional view of the exemplary semiconductor structure of FIG. 13 after removing each patterned sacrificial gate hardmask and each sacrificial gate structure, and thereafter suspending each semiconductor channel material nanosheet.

Referring now to FIG. 14, there is illustrated the exemplary semiconductor structure of FIG. 13 after removing each patterned sacrificial gate hardmask (i.e., the first, second and third sacrificial gate hardmask caps (20P1, 20P2 and 20P3) and each sacrificial gate structure (18P1, 18P2 and 18P3), and thereafter suspending each semiconductor channel material nanosheet 14P.

Each patterned sacrificial gate hardmask (i.e., the first, second and third sacrificial gate hardmask caps (20P1, 20P2 and 20P3) and each sacrificial gate structure (18P1, 18P2 and 18P3) can be removed utilizing one or more anisotropic or isotropic etching processes. Next, each semiconductor channel material nanosheet 14P is suspended by selectively etching each recessed sacrificial semiconductor material nanosheet 12R relative to each semiconductor channel material nanosheet 14P. Gate cavities are formed. Notably, a first gate cavity G1 is provided in an area previously occupied by the first sacrificial gate structure 18P1, a second gate cavity G2 is provided in an area previously occupied by the second sacrificial gate structure 18P2, and a third gate cavity G3 is provided in an area previously occupied by the third sacrificial gate structure 18P3. In some embodiments, the second gate cavity GC2 is not formed.

Figure 15:
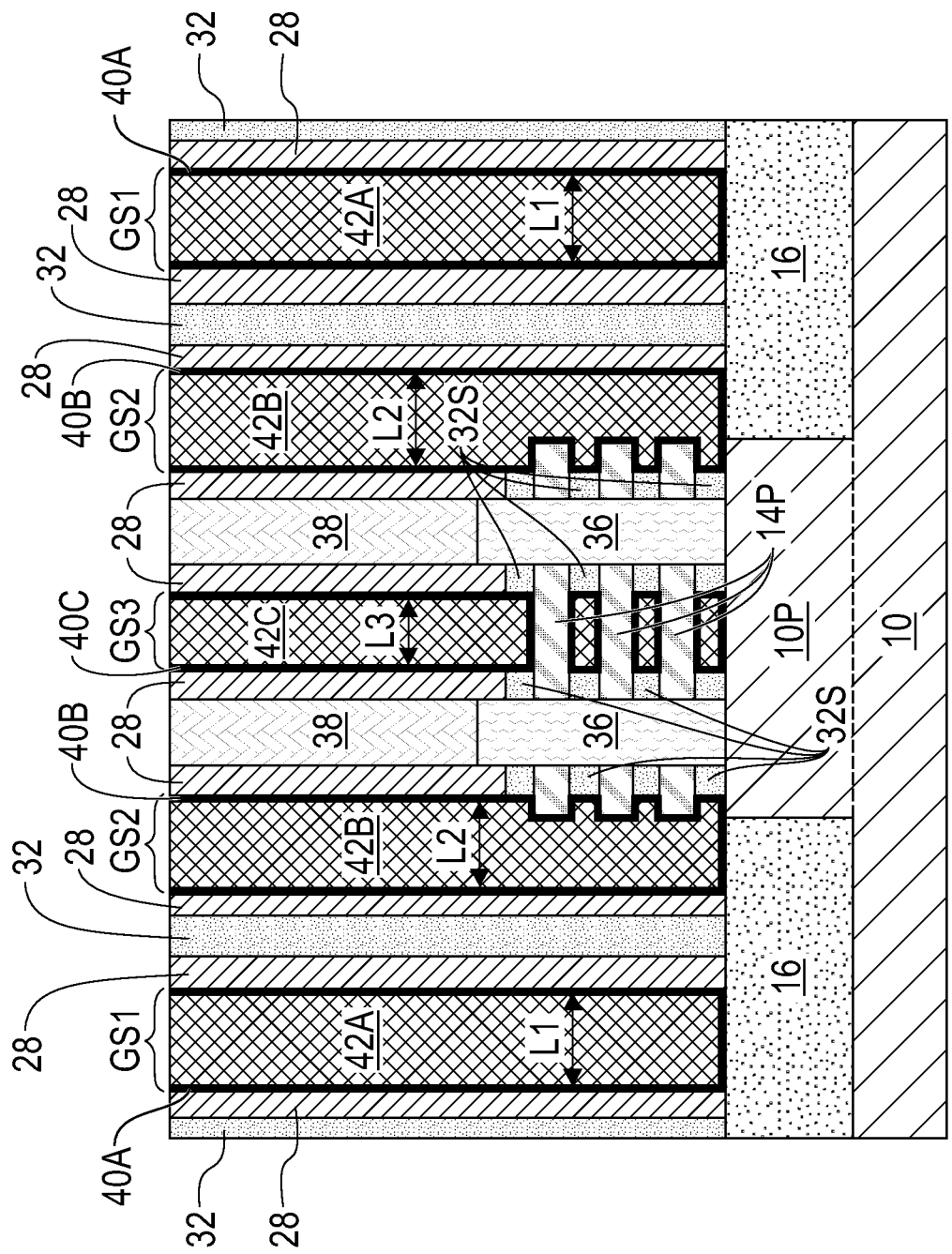
FIG. 15 is a cross sectional view of the exemplary semiconductor structure of FIG. 14 after forming a gate structure in each gate cavity, wherein the gate structure located over the shallow trench isolation structure has a length that is greater than a length of the gate structure located over the semiconductor material pedestal region.

Referring now to FIG. 15, there is illustrated the exemplary semiconductor structure of FIG. 14 after forming a gate structure (GS1, GS2 and GS3) in each gate cavity (GC1, GC2, and GC3, respectively), wherein the gate structure GS1 located over the shallow trench isolation structure 16 has a length L1 that is greater than a length L3 of the gate structure GS3 located over the semiconductor material pedestal region 10P. A second gate structure GS2 can be formed in the transition region and between the first gate structure GS1 and the third gate structure GS3. The second gate structure GS2 has a length, L2, that is less than L1, but greater than L3. The second and third gate structures (GS2 and GS3) surround a physically exposed surface of each semiconductor channel material nanosheet 14P. In some embodiments, the second gate structure GS2 is not formed.

The first gate structure GS1, which is a non-active (i.e., non-functional) gate structure, includes a first gate dielectric portion 40A and a first gate conductor portion 42A. The second gate structure GS2, which is a transition gate structure, includes a second gate dielectric portion 40B and a second gate conductor portion 42B. The term "transition gate structure" denotes a gate structure that is partially active. The third gate structure GS3, which is an active (i.e., functional) gate structure, includes a third gate dielectric portion 40C and a third gate conductor portion 42C.

Each gate dielectric portion (40A, 40B and 40C) includes a gate dielectric material. The gate dielectric material that provides each gate dielectric portion (40A, 40B and 40C) can be an oxide, nitride, and/or oxynitride. In one example, the gate dielectric material that provides each gate dielectric portion (40A, 40B and 40C) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion (40A, 40B and 40C). The gate dielectric portions (40A, 40B and 40C) of each gate structure (GS1, GS2 and GS3) may be composed of a same, or a different, gate dielectric material.

The gate dielectric material used in providing each gate dielectric portion (40A, 40B and 40C) can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material used in providing each gate dielectric portion (40A, 40B and 40C) can have a thickness in a range from 1 nm to 10 nm. Other thicknesses that are lesser than, or greater than, the aforementioned thickness range can also be employed for the gate dielectric material that may provide each gate dielectric portion (40A, 40B and 40C).

Each gate conductor portion (42A, 42B and 42C) includes a gate conductor material. The gate conductor material used in providing each gate conductor portion (42A, 42B and 42C) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), an elemental metal carbide (e.g., titanium carbide and titanium carbide doped with aluminum) or multilayered combinations thereof. In one embodiment, each gate conductor portion (42A, 42B and 42C) may comprise an nFET gate metal. In another embodiment, each gate conductor portion (42A, 42B and 42C) may comprise a pFET gate metal. The gate conductor portion (42A, 42B and 42C) of each gate structure (GS1, GS2 and GS3) may be the same, or a different, gate conductive material.

The gate conductor material used in providing each gate conductor portion (42A, 42B and 42C) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing each gate conductor portion (42A, 42B and 42C) can have a thickness from 50 nm to 200 nm. Other thicknesses that are lesser than, or greater than, the aforementioned thickness range can also be employed for the gate conductor material used in providing each gate conductor portion (42A, 42B and 42C).

The gate structures (GS1, GS2 and GS3) can be formed by providing a gate material stack of the gate dielectric material, and the gate conductor material. A planarization process may follow the formation of the gate material stack. In some embodiments, each gate structure (GS1, GS2 and GS3) has a topmost surface that is coplanar with a topmost surface of the ILD material layer 38.

Figure 16:
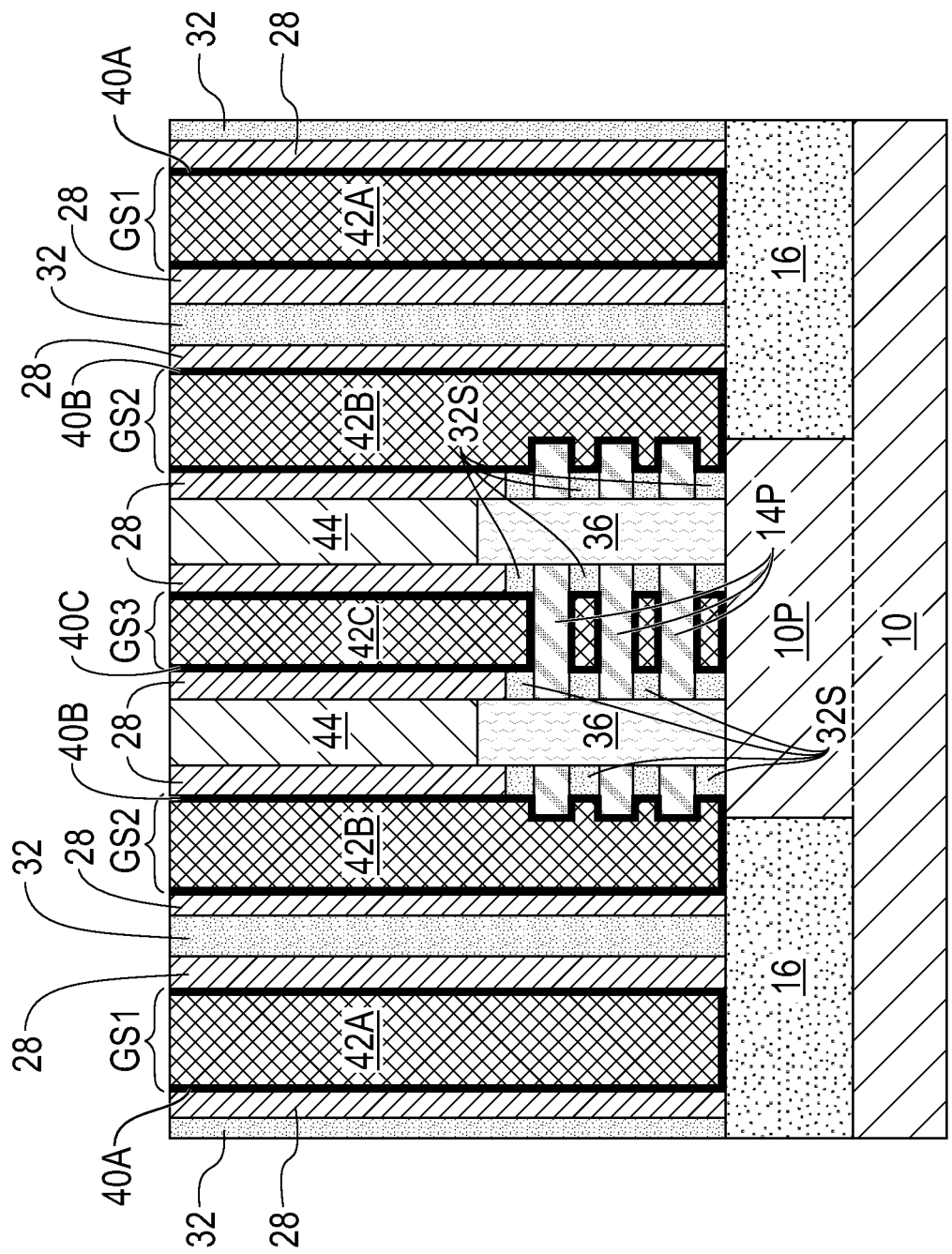
FIG. 16 is a cross sectional view of the exemplary semiconductor structure of FIG. 15 after forming source/drain contact structures.

Referring now to FIG. 16, there is illustrated the exemplary semiconductor structure of FIG. 15 after forming source/drain contact structures 44. The source/drain contact structures 44 can be formed by first providing contact openings in the ILD material 38 which physically expose each source/drain structure 38. The contact openings can be formed by lithography and etching. Each contact opening is then filled with a conductive metal-containing fill material; the filling may include any suitable deposition process such as, for example, chemical vapor deposition (CVD), plasma enhanced chemical vapor deposition (PECVD) or atomic layer deposition (ALD). The conductive metal-containing fill material can be composed of tungsten (W), aluminum (Al), copper (Cu), cobalt (Co), nickel (Ni), titanium (Ti), ruthenium (Ru), or any other suitable conductive metal or alloy thereof. The source/drain contact structures 44 may further include a barrier layer that is composed of a barrier material that can prevent diffusion and/or alloying of the conductive metal-containing fill material with the top of the source/drain structure 38. Examples of barrier materials that may be employed in the present application include titanium nitride (TiN), tantalum nitride (TaN), hafnium nitride (HfN), niobium nitride (NbN), tungsten nitride (WN), tungsten carbon nitride (WCN), or any combination thereof. The barrier layer can be formed in the contact openings by a deposition process such as, for example, chemical vapor deposition (CVD), plasma enhanced chemical vapor deposition (PECVD), atomic layer deposition (ALD), or metalorganic chemical vapor deposition (MOCVD). A planarization process may follow the filling of each contact opening with the conductive metal-containing fill material. The contact structures 44 are embedded in the ILD material layer 38 and have topmost surfaces that are coplanar with each gate structure.

FIGS. 15 and 16 illustrate a semiconductor structure in accordance with the present application. The semiconductor structure includes a shallow trench isolation structure 16 laterally surrounding a semiconductor material pedestal region 10P. A non-active gate structure GS1 is located on the shallow trench isolation structure 16, and an active gate structure GS3 having a length L3 that is less than a length L1 of the non-active gate structure is located on the semiconductor material pedestal region 10P. The active gate structure GS3 wraps around a portion of each semiconductor channel material nanosheet 14P of a plurality of suspended semiconductor channel material nanosheets.

In some embodiments, a transition gate structure GS2 is also illustrated that has a length L2 that is less than the length L1 of the non-active gate structure GS1, but greater than the length L3 of the active gate structure GS3. The transition gate structure GS2 is located between the non-active structure GS1 and the active gate structure GS3 and present partially on the shallow trench isolation structure 16 and partially on the semiconductor material pedestal region 10P. An end portion of the transition gate structure GS2 wraps around another portion of each semiconductor channel material nanosheet 14P of the plurality of suspended semiconductor channel material nanosheets. An inner dielectric spacer 32 located on a sidewall of the transition gate structure GS2 and a sidewall of the active gate structure GS3 and present above and beneath each semiconductor channel material nanosheet 14P of the plurality of stacked and suspended semiconductor channel material nanosheets.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a shallow trench isolation structure laterally surrounding a semiconductor material pedestal region;
    a non-active gate structure located on the shallow trench isolation structure; and
    an active gate structure having a length that is less than a length of the non-active gate structure and located on the semiconductor material pedestal region, wherein the active gate structure wraps around a portion of each semiconductor channel material nanosheet of a plurality of suspended semiconductor channel material nanosheets.

2. The semiconductor structure of claim 1, further comprising a transition gate structure having a length that is less than the length of the non-active gate structure, but greater than the length of the active gate structure located between the non-active active structure and the active gate structure and present partially on the shallow trench isolation structure and partially on the semiconductor material pedestal region.

3. The semiconductor structure of claim 2, wherein an end portion of the transition gate structure wraps around another portion of each semiconductor channel material nanosheet of the plurality of suspended semiconductor channel material nanosheets.

4. The semiconductor structure of claim 2, further comprising an inner dielectric spacer located on a sidewall of the transition gate structure and sidewall of the active gate structure and present above and beneath each semiconductor channel material nanosheet of the plurality of stacked and suspended semiconductor channel material nanosheets.

5. The semiconductor structure of claim 2, further comprising an anchoring dielectric spacer located between the non-active gate structure and the transition gate structure and present on the shallow trench isolation structure.

6. The semiconductor structure of claim 5, further comprising a dielectric spacer located on each side of the anchoring dielectric spacer and present on the shallow trench isolation structure, wherein one of the dielectric spacers is located between the anchoring dielectric spacer and the non-active gate structure, and another of the dielectric spacers is located between the anchoring dielectric spacer and the transition gate structure.

7. The semiconductor structure of claim 5, wherein the anchoring dielectric spacer has a topmost surface that is coplanar with a topmost surface of each dielectric spacer.

8. The semiconductor structure of claim 1, further comprising a source/drain (S/D) structure located on each side of the active gate structure, wherein a portion of the S/D structure physically contacts a sidewall of each of the each semiconductor channel material nanosheet of the plurality of stacked and suspended semiconductor channel material nanosheets.

9. The semiconductor structure of claim 1, further comprising a contact structure contacting a surface of the source/drain structure.

10. The semiconductor structure of claim 1, further comprising a semiconductor material layer located beneath the shallow trench isolation structure and the semiconductor material pedestal region.

* * * * *